United States Patent
Stehlik et al.

(10) Patent No.: US 12,288,018 B2
(45) Date of Patent: Apr. 29, 2025

(54) QUANTUM LOGIC CIRCUIT QUBIT LAYOUTS

(71) Applicant: International Business Machines Corporation, Armonk, NY (US)

(72) Inventors: Jiri Stehlik, New York, NY (US); David Zajac, Valley Cottage, NY (US); George Andrew Keefe, Cortlandt Manor, NY (US); Srikanth Srinivasan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 516 days.

(21) Appl. No.: 17/536,706

(22) Filed: Nov. 29, 2021

(65) Prior Publication Data
US 2023/0169252 A1 Jun. 1, 2023

(51) Int. Cl.
*G06F 30/392* (2020.01)
*G06N 10/20* (2022.01)

(52) U.S. Cl.
CPC .......... *G06F 30/392* (2020.01); *G06N 10/20* (2022.01)

(58) Field of Classification Search
CPC ....... G06F 30/392; G06N 10/20; G06N 10/40
See application file for complete search history.

(56) References Cited

U.S. PATENT DOCUMENTS

| 7,624,088 | B2 | 11/2009 | Johnson et al. |
| 10,235,634 | B1 | 3/2019 | Chen et al. |
| 10,452,991 | B1 * | 10/2019 | Ganzhorn ............ B82Y 10/00 |
| 10,572,816 | B1 | 2/2020 | Vavilov et al. |
| 2015/0111754 | A1 * | 4/2015 | Harris .................. H03K 3/38 365/162 |

(Continued)

FOREIGN PATENT DOCUMENTS

| WO | 2018063139 A1 | 4/2018 |
| WO | 2020081805 A1 | 4/2020 |

OTHER PUBLICATIONS

International Search Report and Written Opinion for International Application No. PCT/EP2022/083565 dated Feb. 21, 2023.

(Continued)

*Primary Examiner* — Nghia M Doan
(74) *Attorney, Agent, or Firm* — Amin, Turocy & Watson, LLP

(57) ABSTRACT

One or more systems, devices and/or methods of use provided herein relate to a device that can facilitate reduction of inter-qubit cross talk and/or allow for increased interaction strengths between qubits as compared to existing technologies. A device can comprise a qubit lattice comprising a plurality of repeated and connected unit cells, and the unit cells comprising individual sets of qubits, wherein the unit cells comprise different cross talk groups of qubits having qubit islands connected together by couplers in different orders, and wherein the different cross talk groups are repeated among the unit cells of the qubit lattice. A device can comprise a qubit lattice comprising a plurality of different, interconnected cross talk groups of qubits, wherein the different cross talk groups are repeated within the qubit lattice.

21 Claims, 14 Drawing Sheets
(7 of 14 Drawing Sheet(s) Filed in Color)

(56) References Cited

U.S. PATENT DOCUMENTS

| | | | |
|---|---|---|---|
| 2016/0267032 A1* | 9/2016 | Rigetti | G06N 10/40 |
| 2019/0347576 A1* | 11/2019 | von Salis | G06N 10/00 |
| 2019/0385673 A1 | 12/2019 | Bosman et al. | |
| 2021/0013391 A1 | 1/2021 | Johnson et al. | |
| 2021/0192380 A1 | 6/2021 | Jin et al. | |

OTHER PUBLICATIONS

Rene Vollmer: "Fast and scalable readout for fault-tolerant quantum computing with superconducting Qubits", Jul. 10, 2018 (Jul. 10, 2018), XP055765101, figures 2.6, 5.4, 5.5, p. 1, line 15-line 32, p. 8, line 26-line 31, p. 25, line 1-line 7, p. 27, line 7-line 18.

Moskalenko I N et al: "Tunable coupling scheme for implementing two-qubit gates on fluxonium qubits", arxiv.org, Cornell University Library, 201 Olin Library Cornell University Ithaca, NY 14853, Jul. 24, 2021 (Jul. 24, 2021), XP091015998, abstract; figures 1, 3 p. 1, col. 2, line 5-p. 2, col. 1, line 19 p. 3, col. 1, line 2-col. 2, line 28.

Stehlik J et al: "Tunable Coupling Architecture for Fixed-frequency Transmons", arxiv.org, Cornell University Library, 201 Olin Library Cornell University Ithaca, NY 14853, Jan. 19, 2021 (Jan. 19, 2021), XP081862804, abstract; figure 1 p. 1, col. 1, line 1-p. 2, col. 2, line 28.

Harris et al., "A Compound Josephson Junction Coupler for Flux Qubits With Minimal Crosstalk" Jul. 2009. https://arxiv.org/pdf/0904.3784.pdf (5 pages).

Chu et al., "Coupler-Assisted Controlled-Phase Gate with Enhanced Adiabaticity" Jun. 2021 (22pages). arXiv:2106.00725v1 [quant-ph] Jun. 1, 2021.

Yanay et al., "Mediated interactions beyond the nearest neighbor in an array of superconducting qubits" Oct. 2021 (10 pages). arXiv:2110.01699v1.

Mell et al., "The NIST Definition of Cloud Computing," Recommendations of the National Institute of Standards and Technology, NIST Special Publication 800-145, Sep. 2011, 7 pages.

U.S. Application for "Tiling of Cross-Resonance Gates for Quantum Circuits" U.S. Appl. No. 17/369,376, filed Jul. 7, 2021.

* cited by examiner

QUANTUM LOGIC CIRCUIT QUBIT LAYOUTS

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in one or more cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a most performance can be extracted from near-term error-prone systems and/or so that a quality of measurements relative to the one or more qubits of the respective quantum systems compiling into physical-level pulses can be improved (e.g., related to accuracy, precision and/or measurement efficiency).

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to array a plurality of qubits to achieve optimal performance characteristics of the plurality of qubits, such as in view of the array comprising a plurality of nearest-neighbor qubits relative to one another.

In accordance with an embodiment, a device can comprise a qubit lattice comprising a plurality of repeated and connected unit cells, and the unit cells comprising individual sets of qubits, wherein the unit cells can comprise different cross talk groups of qubits having qubit islands connected together by couplers in different orders, and wherein the different cross talk groups can be repeated among the unit cells of the qubit lattice.

In accordance with another embodiment, a system can comprise a quantum processor, and a qubit circuit coupled to the quantum processor, wherein the qubit circuit can comprise a qubit lattice comprising a plurality of repeated and connected unit cells, and the unit cells comprising individual sets of qubits, wherein the unit cells can comprise different cross talk groups of qubits having qubit islands connected together by couplers in different orders, and wherein the different cross talk groups can be repeated among the unit cells of the qubit lattice.

In accordance with yet another embodiment, a method can comprise fabricating, by a system operatively coupled to a processor, a qubit lattice by arranging a plurality of repeated and connected unit cells, wherein the unit cells comprise individual sets of qubits. The method also can comprise fabricating, by the system, the unit cells comprising different cross talk groups of qubits having qubit islands connected together by couplers in different orders, wherein the different cross talk groups are repeated among the unit cells of the qubit lattice.

An advantage of the aforementioned device, system and/or method can be minimized inclusion of high cross talk groups within a multi-qubit arrangement. Further in view of the multi-qubit arrangement including a plurality of nearest-neighbor qubits, cross talk can generally be minimized between the plurality of qubits, and thus stray inadvertent couplings between qubits or between couplers and non-intended qubits can be limited. This arrangement thus can allow for greater interaction strengths between qubits to be employed.

In one or more embodiments of the aforementioned device, system and/or method, the device can comprise the unit cells comprising first cross talk groups of qubits having qubit islands connected together in a first order by a plurality of couplers, and the unit cells comprising second cross talk groups of qubits having qubit islands connected together in a second order by another plurality of couplers, wherein the first cross talk groups are operable with greater cross talk than the second cross talk groups. An advantage can be facilitating the minimization of high cross talk groups, where it can be desirable for outer qubits of a cross talk configuration to have higher resonant frequency, which than can be inadvertently shifted less. This reduced inadvertent shifts can lead to a lower probability of an undesirable collision between resonant frequencies.

In one or more embodiments of the aforementioned device, system and/or method, the qubit lattice can have the form of a heavy hex lattice or square lattice. An advantage can be tiling of qubits within the lattice to provide the minimized cross talk.

In one or more embodiments of the aforementioned device, system and/or method, one or more of the couplers coupling the qubits of the plurality of qubits to one another can be flux tunable. An advantage can be ability to dynamically tune one or more resonant frequencies of one or more of the qubits.

In one or more embodiments of the aforementioned device, system and/or method, the qubit lattice can comprise first qubits and second qubits, wherein the first qubits can be coupled to no more than a pair of second qubits.

In one or more embodiments of the aforementioned device, system and/or method, two or more different cross talk groups can include common qubits.

In one or more embodiments of the aforementioned device, system and/or method, cross talk groups having higher cross talk than cross talk groups having lower cross talk can include common qubits.

In accordance with still another embodiment, a device can comprise a qubit lattice comprising a plurality of different, interconnected cross talk groups of qubits, wherein the different cross talk groups are repeated within the qubit lattice.

An advantage of the device can be limiting the overall amount of cross talk between the plurality of qubits by particular arrangement of the qubits, such as where one or more of the qubits can be less likely to shift in resonant frequency.

In accordance with yet another embodiment, a device can comprise a qubit lattice comprising rows that comprise alternated first qubits and second qubits connected in series, wherein the first qubits can have a higher common resonant frequency range than a common resonant frequency range of the second qubits, and wherein the rows can comprise qubit islands of the first and second qubits connected in a same connection order at different rows of the rows.

An advantage of the device can be limiting the overall amount of cross talk between the plurality of qubits by particular arrangement of the second qubits being less likely to shift in resonant frequency.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
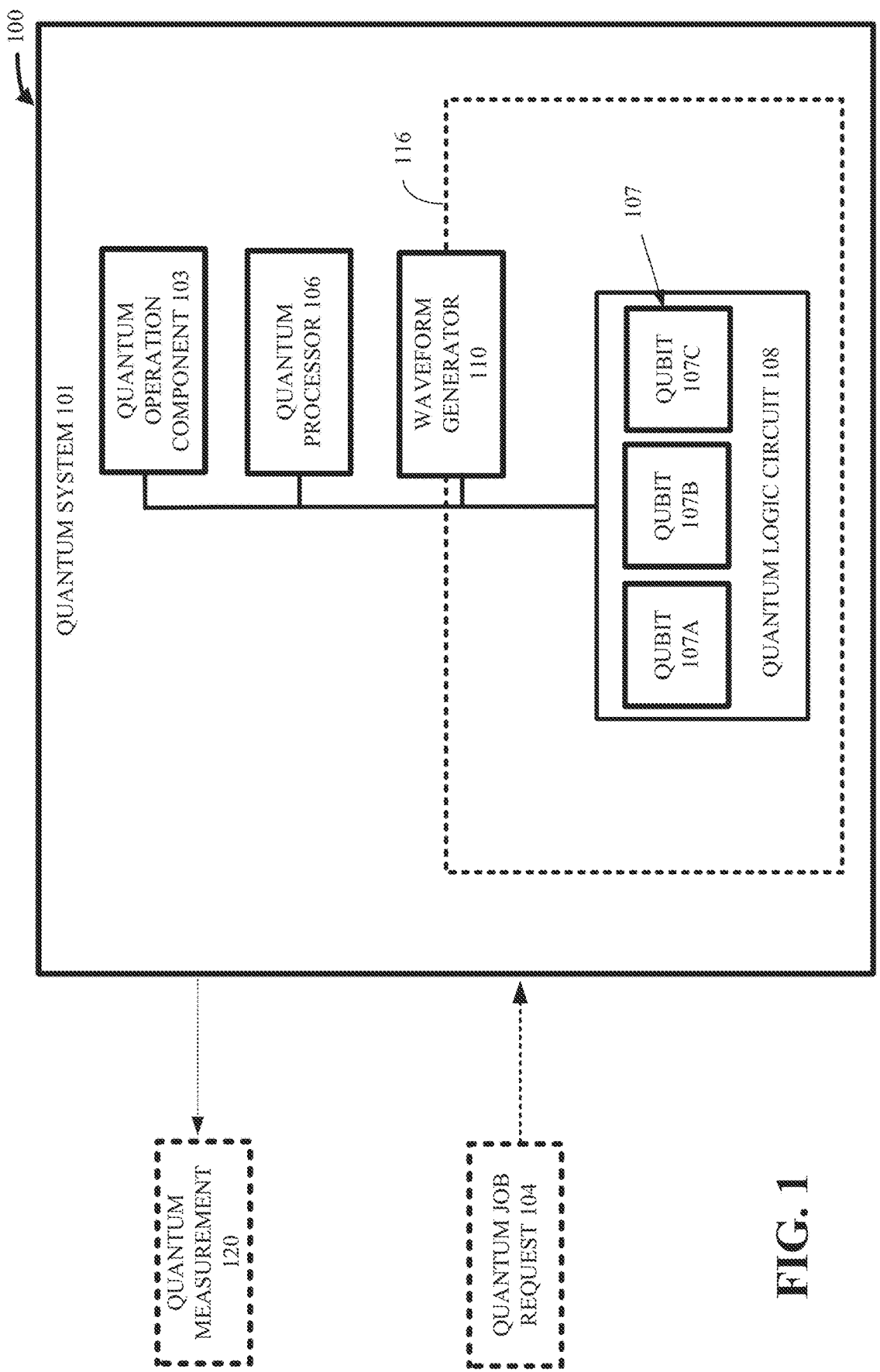
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

Quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle + \beta|1\rangle$, where $\alpha$ and $\beta$ are complex scalars (such that $|\alpha|^2 + |\beta''|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs can employ coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information using laws of quantum mechanics, quantum computers can offer novel ways to perform computation tasks such as molecular calculations, optical photons, optimization, and many more. Many algorithms and system components can be introduced to perform such computational tasks efficiently.

In current technologies, a logic circuit comprising a plurality of qubits can be limited by a finite on/off ratio of qubits due to stray couplings, such as between nearest neighbor qubits. As used herein "nearest neighbor" refers to a qubit, most adjacent along a connected chain, to a coupler to which that nearest neighbor qubit is not connected. For example, a qubit chain can include three qubits Q1, Q2 and Q3 in series, coupled by two couplers between the three qubits. A coupler is thus directly connected between Q1 and Q2, and also between Q2 and Q3. Q3 can be a next neighbor qubit to the coupler between Q1 and Q2, where Q3 can unintendedly couple (e.g., stray coupling) with that coupler between Q1 and Q2. Other such unintended couplings also can occur. Further, where qubit chains or layouts include a plurality of qubits, such stray couplings can increase, thus decreasing ability to control the qubits, states of qubits, resonant frequencies of qubits and/or coherency of qubits. That is, performance of quantum gates can be affected. To account for such concerns, existing technologies can limit the number of qubits in a chain, layout or other grouping and/or interaction strengths can be limited to lessen chance for such stray couplings.

One or more devices, systems and/or methods described herein can account for one or more of these deficiencies, and thereby allowing for increasing the number of qubits in a chain, layout or other grouping, relative to existing technologies. Further, interaction strength limit can be increased relative to existing technologies.

To accomplish one or more of these features, a plurality of qubits can be aligned in a tiling arrangement where sets of qubits having different levels of cross talk are comprised by the tiling arrangement. In the tiling arrangement, and in the sets of qubits, qubits having different resonant frequencies can be included. Arrangement of the qubits of the differing frequencies can isolate and/or insulate qubits with lower comparable resonant frequencies (e.g., as compared to qubits having higher comparable resonant frequencies of the plurality of qubits) being more likely to shift in resonant frequency. As such, qubits having higher comparable resonant frequencies can bound the qubits having lower comparable resonant frequencies, such as in series connections of the qubits. In architecture where the resonant frequency of the bus is lower than the qubits, the qubits having higher comparable resonant frequencies can be less likely to shift in resonant frequency and/or also can experience stray couplings similar to the qubits having lower comparable resonant frequencies.

Generally, particular connections of qubit islands to one another, qubits to one another, and order of qubit connections can reduce stray couplings and/or minimize amount of cross talk between the higher number of qubits in such tiling arrangement. Couplers, or other buses, between qubits can be flux tunable.

The plurality of qubits and couplers can be arranged in the tiling arrangement such as on a qubit chip connectable to a quantum processor and/or other quantum electronics of a quantum system. The tiling arrangement can be formed by coupling a plurality of copies of a unit cell of qubits and couplers. Each unit cell can have a common connection scheme.

That is, one or more embodiments described herein relate to alignment of qubits in a multi-qubit arrangement, such as a tiling arrangement. For example, a two-dimensional tiling arrangement can be arranged at a quantum chip of a quantum system. Via the arrangement, resiliency can be built into inter-qubit interactions, thus leading to resiliency in measurement/readout of qubits on which gates are performed.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job, such as by minimizing cross talk and thus stray qubit couplings between qubits of a plurality of arrayed qubits of a quantum system, such as relative to a requested quantum job comprising requested execution of one or more quantum gates.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics such as including an interferometer device 112, a waveform generator 110, and/or a quantum logic circuit 108 comprising a plurality of qubits 107 (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum processor 106, can execute operation of a quantum logic circuit on the plurality of qubits 107 of the quantum logic circuit 108 (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 can be contained in a cryogenic environment, such as generated by a cryogenic chamber 116, such as a dilution refrigerator. Indeed, a signal can be generated by the waveform generator 110 within the cryogenic chamber 116 to affect one or more of the plurality of qubits 107. Where the plurality of qubits 107 are superconducting qubits, cryogenic temperatures, such as about 4K or lower can be employed to facilitate function of these physical qubits. Accordingly, the elements of the quantum measurement circuit 110 also are to be constructed to perform at such cryogenic temperatures.

Limiting and/or prevention of stray couplings between qubits and/or between a qubit and a coupler/bus, and/or minimization of cross talk between qubits, can be effected by a particular arrangement, such as a tiling arrangement (e.g., qubit layout) of the plurality of qubits 107, of the quantum logic circuit 108.

The following/aforementioned description(s) refer(s) to the operation of a single quantum program from a single quantum job request on a quantum logic circuit having a single arrangement. This operation can include one or more readouts from cryogenic environment electronics within cryogenic chamber 116 by room temperature control/readout electronics external to the cryogenic chamber 116. However, employment of the arrangement can be scalable such as where two or more such arrangements can be comprised by the quantum log circuit 108 in one or more embodiments. Such different arrangements can be effected by a same or different waveform generators. Further, one or more of the processes described herein can be scalable, also such as including additionally, and/or alternatively, execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
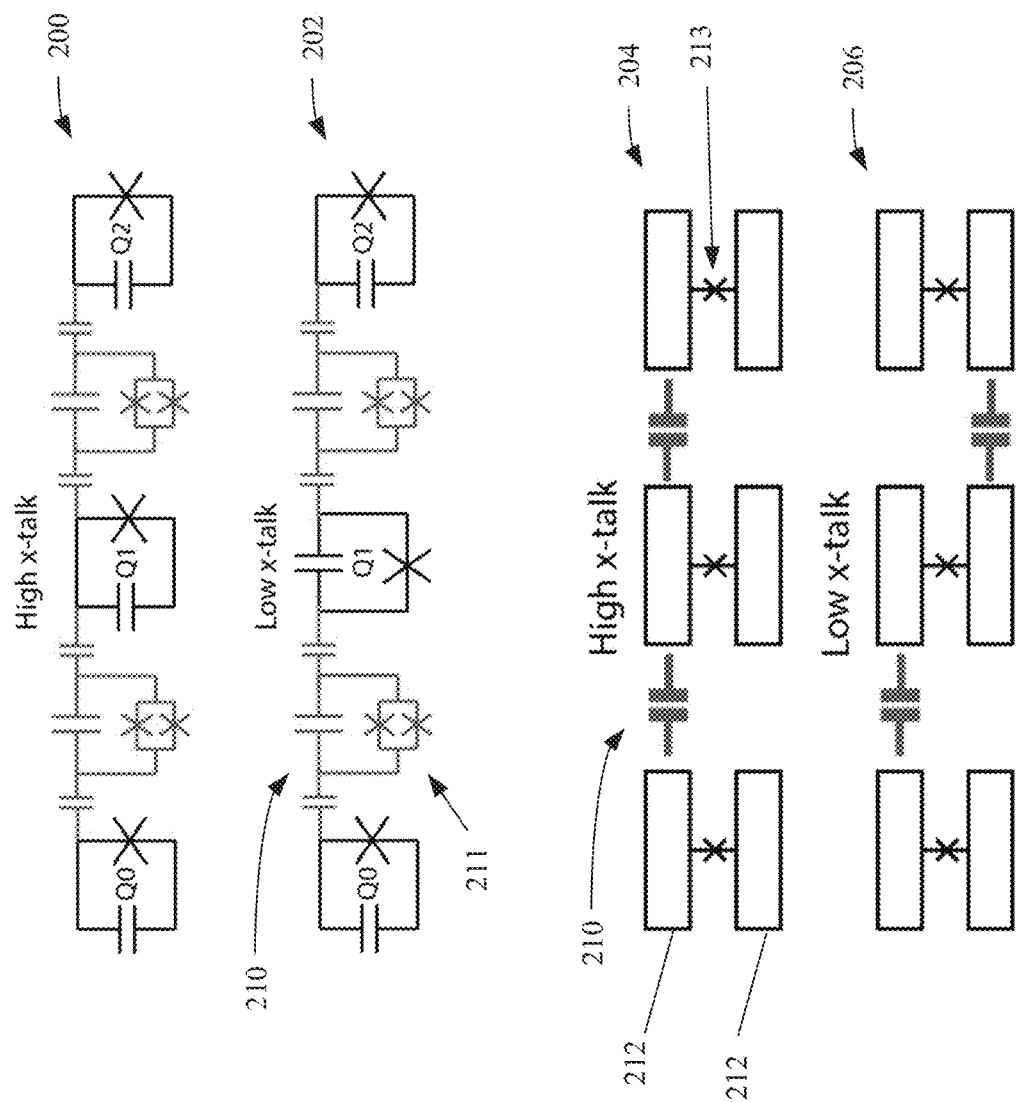
FIG. 2 illustrates a schematic diagram of different cross talk groups, in accordance with one or more embodiments described herein.

Turning now to FIG. 2, illustrated is a plurality of schematic diagrams of example cross talk groups 200, 202, 204 and 206. As indicated above, the one or more qubit layouts described herein can comprise cross talk groups having different levels of cross talk. In one embodiment, the different levels of cross talk can include a high level of cross talk and a low level of cross talk, and thus the cross talk groups can include high cross talk groups and low cross talk groups. The terms high and low are employed relative to one another, where the low cross talk groups have lower cross talk than the high cross talk groups. Minimizing cross talk, and thus minimizing high cross talk groups, is a feature achieved by the one or more layouts of qubits discussed herein.

As shown at FIG. 2, schematic diagrams 200 and 204 each illustrate the same high cross talk group. Likewise, schematic diagrams 202 and 206 each illustrate the same low cross talk group. At schematic diagram 200, a set of qubits, such as three qubits Q0, Q1 and Q2 are coupled together by couplers 210 disposed between the qubits. The couplers 210 are illustrated as tunable couplers in view of each comprising a superconducting quantum interference device (SQUID) 211. In other embodiments, different couplers can be employed in different cross talk groups, or in the same cross talk group. At schematic diagram 202, the same set of qubits is coupled together in a low cross talk arrangement.

Both schematic diagrams 200 and 202 illustrate bus-below-qubit architecture. As illustrated, the bus is presently tunable below the qubits in an off position, and thus the bus-below-qubit architecture. However, in a tiling arrangement either bus-below-qubit or bus-above-qubit architecture can be employed. The architecture can be switched between the two types by reversing the role of higher and lower frequencies of qubits (e.g., permutating).

With reference to the discussion above, a coupling of qubit Q2 with the labeled coupler 210 can be a stray or unintended coupling, where Q2 is a next neighbor qubit relative to the labeled coupler 210. For example, when performing a gate between Q0 and Q1, Q0 and Q1 can be partially hybridized with the coupler 210. The frequencies of Q0 and Q1 can therefore shift. In the illustrated example of bus-below-qubit architecture of high cross talk group 20, both Q0 and Q1 will shift upwards in frequency. If either qubit Q0 or Q1 becomes near degenerate with Q2, spectator error can occur. To limit this occurrence, Q0 and Q2 can be higher frequency qubits relative to a lower frequency qubit Q1, in the one or more arrangements described herein. That is, a qubit with a higher frequency can be further detuned from one or more couplers of the respective cross talk group, and therefore can move less in frequency during operation of a gate. That is, use of Q0 and Q2 as high frequency qubits can minimize collisions, and thus minimize cross talk. In such case, Q0 and Q2 being high frequency qubits can bound the low frequency qubit Q1 where Q0, Q1 and Q2 are coupled in series.

Put another way, when performing operations on qubits, the resonant frequencies of the qubits can be shifted, such as differently shifted, such as to higher frequencies. If the qubits are farther apart, the lower (frequency) qubit in the architecture gets shifted more. Because of this, in a high cross talk configuration, it can be desirable for the outer qubits to be the higher (frequency) qubits, and thus get shifted less, thus providing for less probability of a collision of frequencies occurring.

Accordingly, at the beginning of the gate sequence, the tunable bus or coupler frequency can be set so that an interaction between qubits is negligible. The coupler frequency can be tuned with a flux pulse to turn on the interaction between Q0 and Q1. After the flux pulse finishes, the frequency of the coupler can be returned to the off position and the interaction between Q0 and Q1 can return to negligible. Thus, pulsing the flux tunable couplers (e.g., buses or flux tunable qubit buses) can turn an interaction between qubits from off position to on position.

At schematic diagrams 204 and 206, the cross talk group differences are displayed differently. As illustrated, each real-world physical qubit can comprise a pair of islands 212 (also referred to as paddles) coupled together by a Josephson junction 213. How the different islands 212 are coupled, such as directly connected to one another, can determine whether a group of qubits is a low cross talk group or a high cross talk group. That is, which islands are employed for the intercoupling of the qubits by the couplers 210 can provide such determination.

For example, the high cross talk group 204 includes the inner or low frequency qubit Q1 having both couplers connected to the same island 212. The low cross talk group 206 includes the couplers connected to different islands 212 of the inner or low frequency qubit Q1.

As will be illustrated at, and described relative to, FIGS. 3 to 9, qubits of such arrangements or layouts are not limited to being part of only one cross talk group. Rather, bounding qubits of cross talk groups (e.g., those qubits at ends of qubit strings) can be part of two or more different cross talk groups. That is, evaluation of a qubit layout can be employed to determine cross talk groups.

Figure 3:
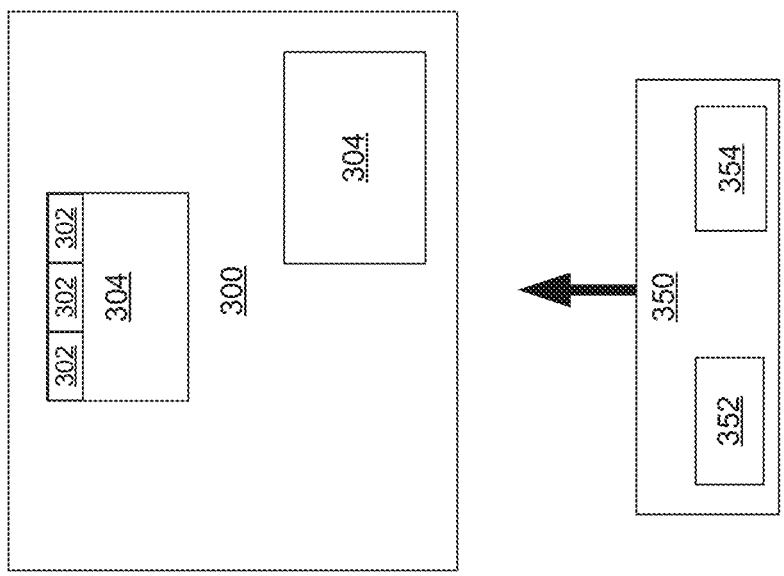
FIG. 3 illustrates an example qubit layout that can be employed in the non-limiting system of FIG. 1, in accordance with one or more embodiments described herein.

Turning next to FIG. 3, as schematically illustrated, a general qubit layout 300 can be defined by a plurality of same unit cells 302. Groups of unit cells 302 can define one or more sections 304 of the general qubit layout 300. A quantum logic circuit, such as the quantum logic circuit 108 of FIG. 1, can comprise a qubit layout 300, which, for example, can be fabricated on a quantum chip that can be operatively coupled to a processor, such as a quantum processor.

As illustrated, the qubit layout 300 can comprise one or more unit cells 302. The qubit layout 300 can be employed at the quantum logic circuit 108 of FIG. 1, for example. The unit cell 302 can be repeated, with the repeated unit cells 302 being interconnected to define and thus form the qubit layout 300. The unit cell 302 can comprise a plurality of real-world physical qubits 307 connected to one another, at least partially in series, by couplers.

Figure 4:
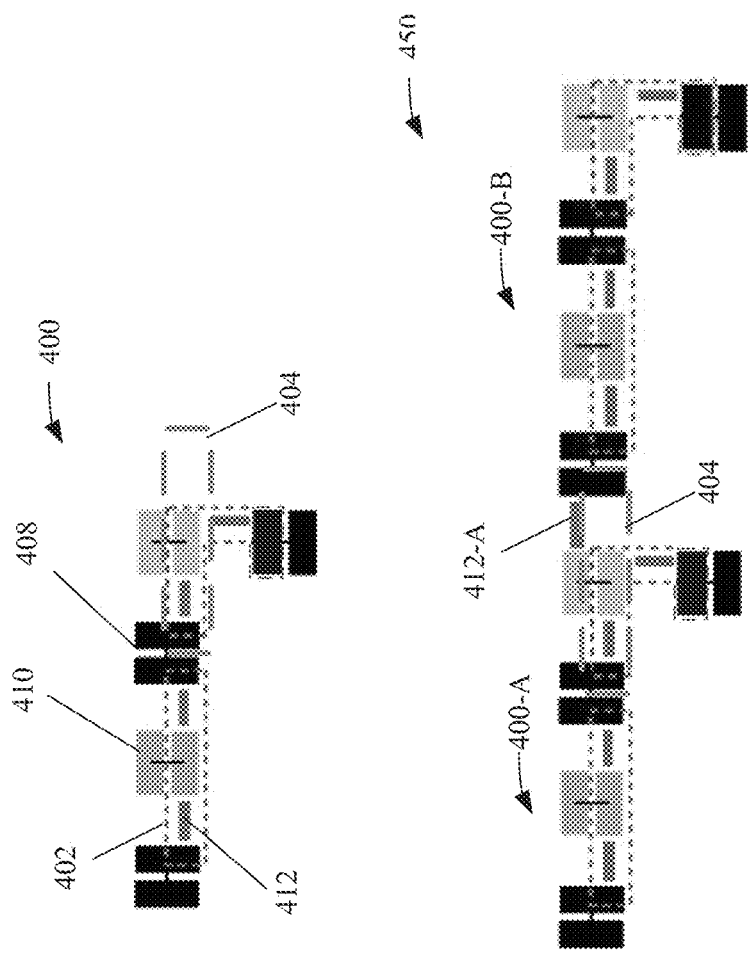
FIG. 4 illustrates an example unit cell and qubit layout comprising a pair of the unit cells, in accordance with one or more embodiments described herein.
Figure 5:
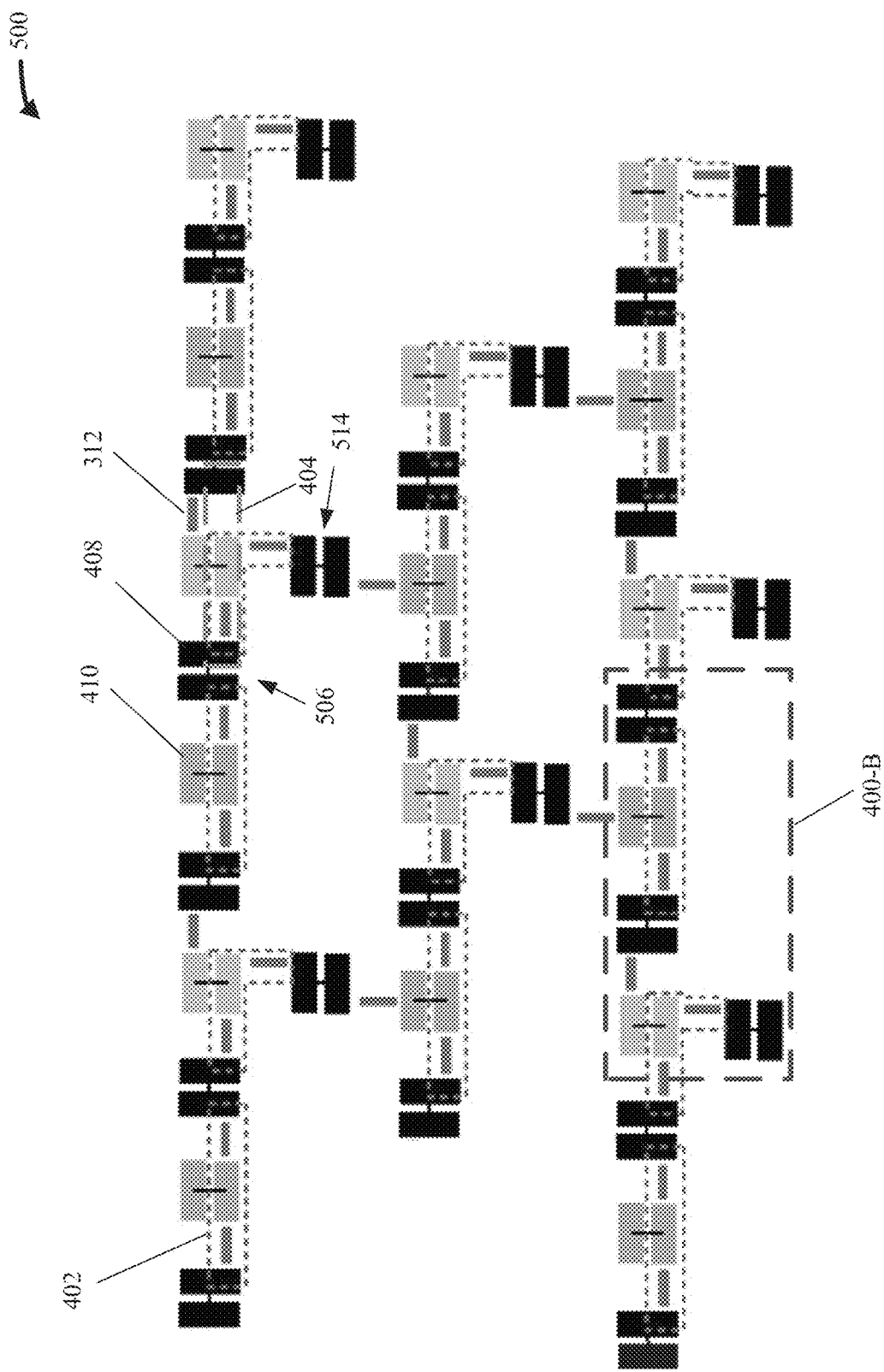
FIG. 5 illustrates a schematic diagram of an example qubit layout based on the unit cell of FIG. 4, in accordance with one or more embodiments described herein.
Figure 6:
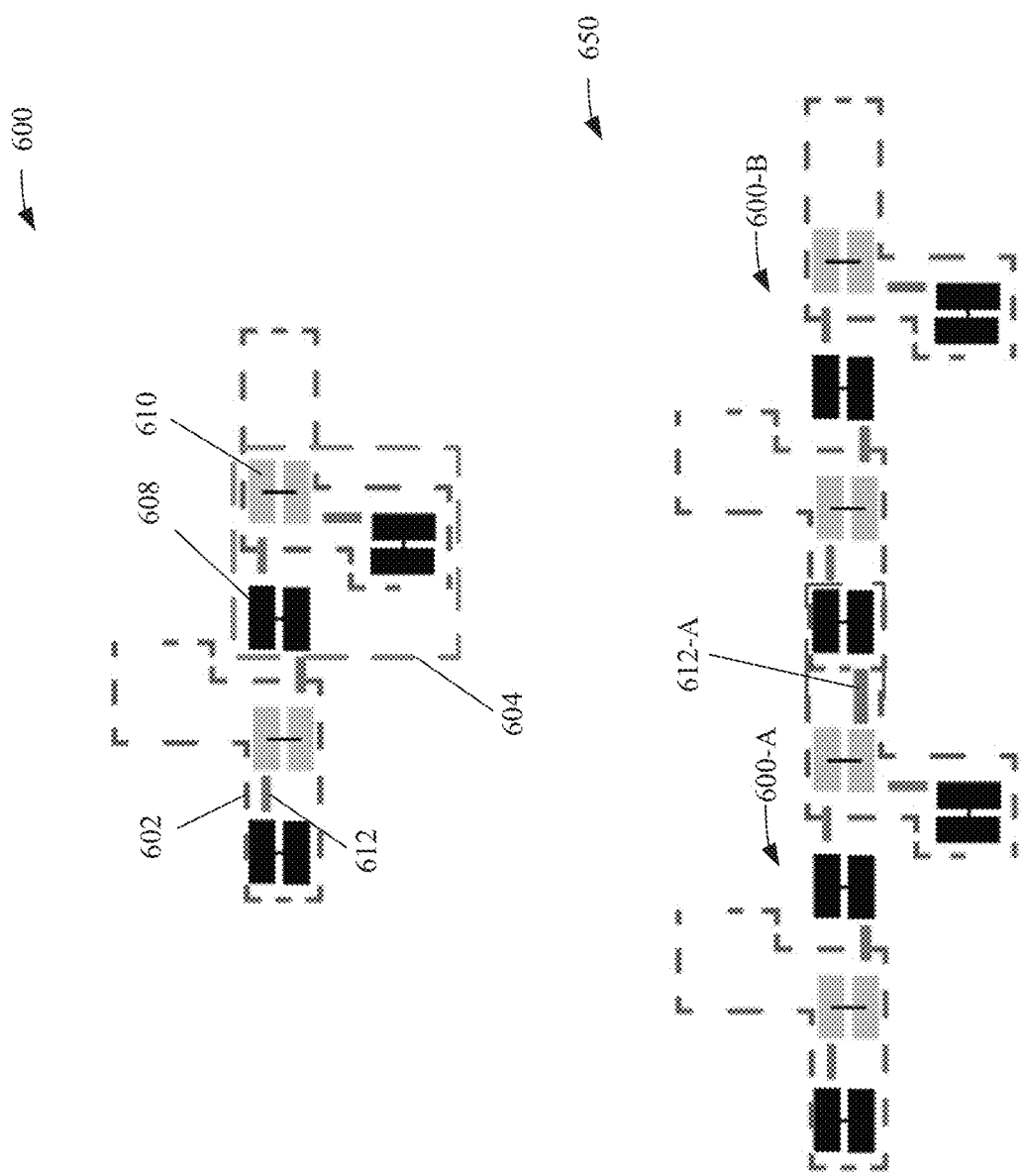
FIG. 6 illustrates another example unit cell and qubit layout comprising a pair of the unit cells, in accordance with one or more embodiments described herein.
Figure 7:
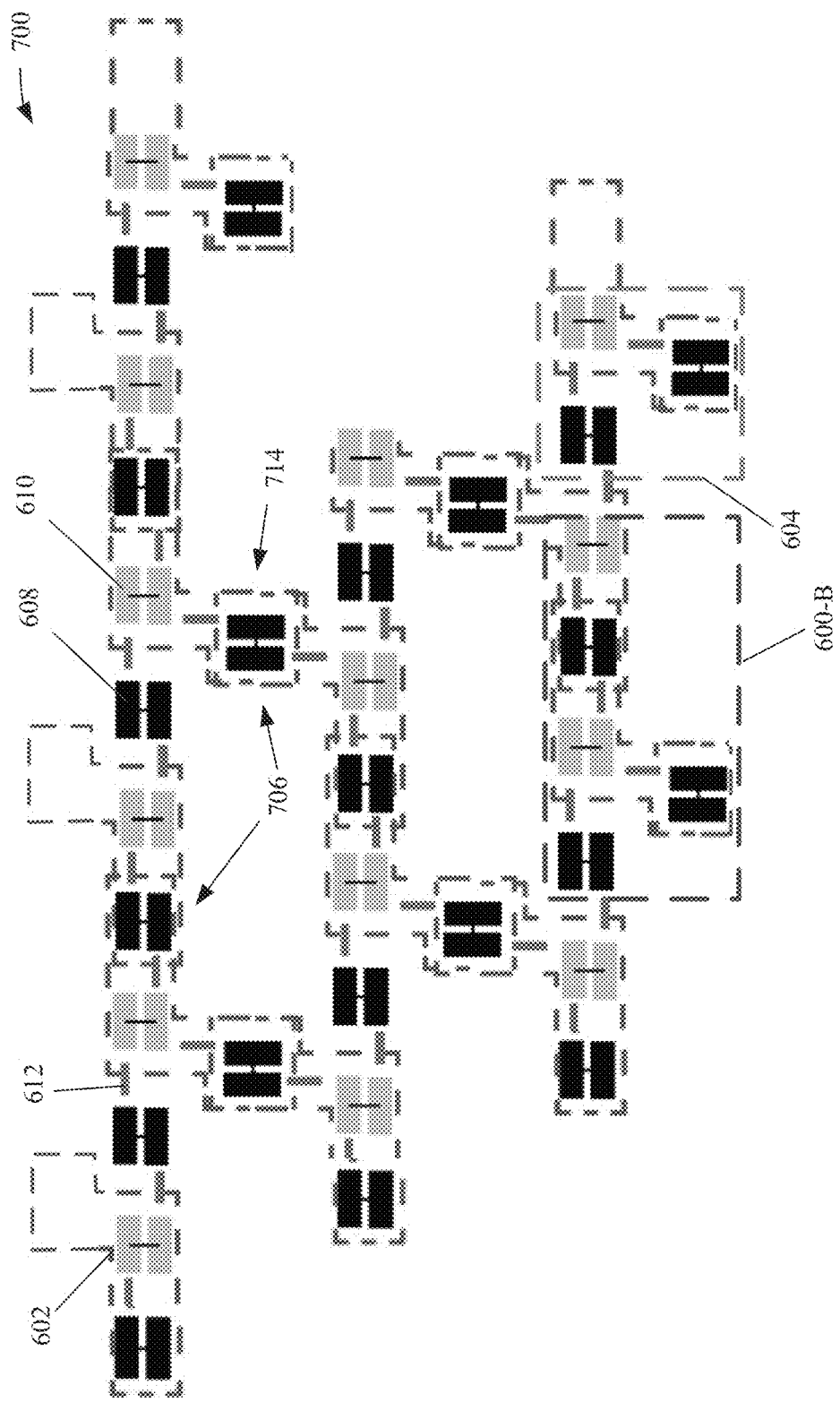
FIG. 7 illustrates a schematic diagram of an example qubit layout based on the unit cell of FIG. 6, in accordance with one or more embodiments described herein.
Figure 8:
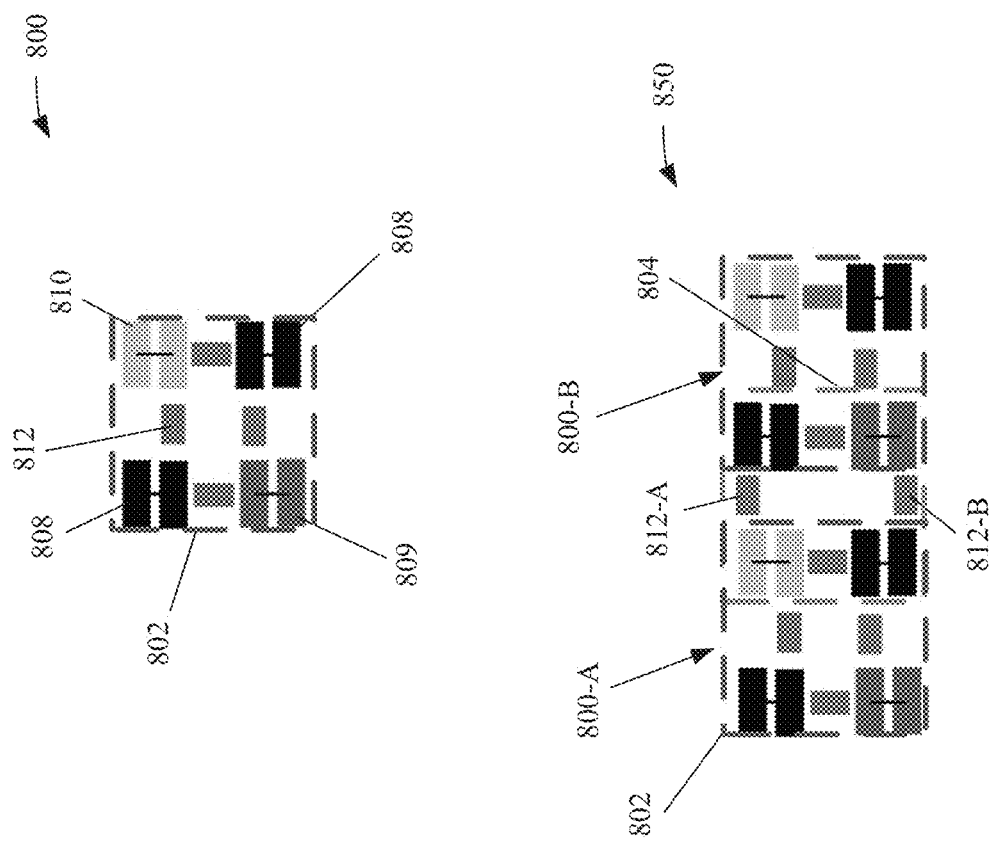
FIG. 8 illustrates yet another example unit cell and qubit layout comprising a pair of the unit cells, in accordance with one or more embodiments described herein.
Figure 9:
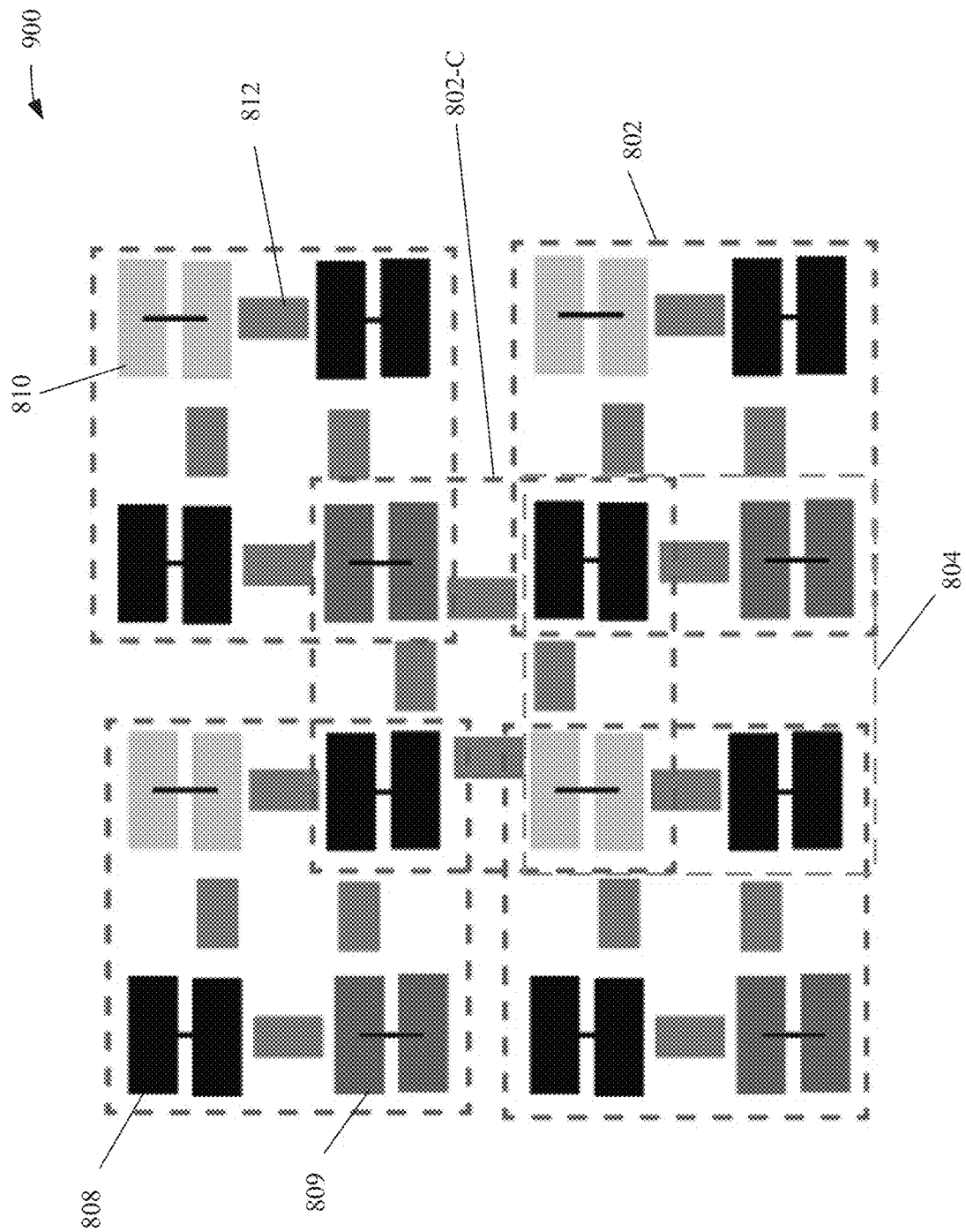
FIG. 9 illustrates a schematic diagram of an example qubit layout based on the unit cell of FIG. 8, in accordance with one or more embodiments described herein.

The qubit layouts at FIGS. 5, 7 and 9 can be formed (e.g., fabricated) by connecting together a same respective unit cell. That is, FIGS. 4, 6 and 8 illustrate different unit cells that can be repeatedly interconnected to form the respective qubit layout sections of FIGS. 5, 7 and 9. The qubit layout sections of FIGS. 5, 7 and 9 can be expanded by adding additional respective unit cells to fabricate a larger qubit layout. That is, the unit cell of FIG. 4 can be repeated to define the qubit layout of FIG. 5. The unit cell of FIG. 6 can be repeated to define the qubit layout of FIG. 7. The unit cell of FIG. 8 can be repeated to define the qubit layout of FIG. 9.

Referring now to FIGS. 4 to 9, three different embodiments are described, with each being based on a base unit cell. Using repeated copies or replicas of the base unit cell, a qubit layout can be fabricated, such as having a form of a qubit lattice.

Referring first generally to the different qubit layouts of FIGS. 5, 7 and 9, a unit cell can be repeated a plurality of times in a plurality of adjacent rows to define, and thus to form, a qubit layout. Generally, the unit cell can comprise different cross talk groups of qubits having qubit islands connected together by couplers in different orders. The different cross talk groups can be repeated among the repeated unit cells of the qubit layout.

Put another way, a qubit layout can comprise a plurality of different, interconnected cross talk groups of qubits, wherein the different cross talk groups are repeated within the qubit layout. The different cross talk groups can comprise at least two different repeated cross talk groups, such as first cross talk groups and second cross talk groups. The first cross talk groups and the second cross talk groups can have different cross talk ranges. For example, the first cross talk groups can have a higher cross talk range than a cross talk range of the second cross talk groups. In one or more embodiments, a qubit layout can comprise a greater quantity of first cross talk groups having a higher cross talk range than a quantity of second cross talk groups.

Qubits of the qubit layout can each comprise a pair of qubit islands, as illustrated at FIG. 2. The first cross talk groups can each comprise a same first connection order of qubit islands. Likewise, the second cross talk groups can each comprise a same second connection order of qubit islands.

Put still another way, a qubit layout can comprise rows that comprise alternated first qubits and second qubits connected in series. The first qubits can have a higher common resonant frequency range than a common resonant frequency range of the second qubits. The rows can comprise qubit islands of the first qubits and second qubits connected in a same connection order at different rows of the qubit layout.

Each of these different descriptions of a qubit layout can define a same qubit layout of any one of FIG. 5, 7 or 9. These different descriptions will be illustrated in detail at FIGS. 5, 7 and 9.

Still referring generally to FIGS. 4 to 9, the qubit layouts 500, 700 and 900 can comprise both high cross talk groups and low cross talk groups. The cross talk groups can generally be coupled in series and/or the qubits of the different cross talk groups can be coupled in series. As used herein, cross talk groups coupled in series to one another can be non-separable, in one or more embodiments, such as where one qubit can be common to both cross talk groups, such as high cross talk groups. That is, five qubits coupled in series, for example, can comprise two high cross talk groups, and thus two high cross talk groups coupled in series. In one or more embodiments, cross talk groups can comprise different qubits and thus can be separable.

With respect to any of FIGS. 4 to 9, the aforementioned high cross talk groups and low cross talk groups of FIG. 2, particularly of the schematic diagrams 204 and 206, can be arranged together, with common qubits of the groups, to form efficient qubit arrangements employed at the unit cells and qubit layouts of FIGS. 4 to 9. As indicated above, these qubit arrangements can provide minimized cross talk, by minimizing the forming of high cross talk groups. In one or more embodiments, high cross talk group quantity can be equal to or less than low cross talk group quantity of an arrangement. Repetitive description of like elements employed in one or more embodiments described herein is omitted for sake of brevity.

With respect to any of FIGS. 4 to 9, a plurality of qubits can be connected together, such as in series-connected groups, by couplers, such as flux tunable couplers, although other coupler types can be employed in addition or in alternative. Qubits of high and low resonant frequencies can be employed. Difference between high frequency and low frequency qubits can be achieved by a size of the Josephson junctions employed to connect the islands of the qubits. For example, a larger Josephson junction can allow for greater tuning/detuning, and thus provide a higher (high) frequency qubit.

Both types of qubits (of high and low frequencies relative to one another) can be employed in a same cross talk groups.

In one or more embodiments, high cross talk groups can share high frequency qubits, such as where two high cross talk groups can comprise the same high frequency qubit. Indeed, two high cross talk groups can couple to different islands of the same high frequency qubit. That is, as indicated above, due to the sharing, cross talk groups coupled in series to one another can be non-separable, in one or more embodiments, such as where one qubit can be common to both cross talk groups, such as high cross talk groups.

Generally, the qubit layouts of FIGS. 5, 7 and 9 can be in the shape of a qubit matrix or qubit lattice. That is, rows of high frequency and low frequency qubits can be connected in series in an alternated manner (e.g., high frequency qubit, low frequency qubit, high frequency qubit, low frequency qubit, and so forth). The rows of qubits can be coupled to one another by connector qubits, such as high frequency qubits. These connector qubits can be spaced apart from one another in a direction along the rows. That is, the spaced apart high frequency qubits between the rows can be non-directly coupled to one another. Put another way, rows of cross talk groups can be coupled to one another, such as directly connected via couplers.

With respect to any of FIGS. 4 to 9, and referencing FIG. 3, in one or more embodiments, one or more operations for fabricating the one or more qubit layouts described herein, such as the qubit layouts 300, 500, 700 and/or 900, can be performed by a manufacturing system, such as a manufacturing system 350 comprising one or more manufacturing devices 352, where the manufacturing system 350 can be operatively coupled to a processor 354 for at least partially controlling the one or more operations. The processor 354 can be any suitable processor. Discussion proved below with respect to processor 1206 can be at least partially equally applicable to the processor 354.

In one or more embodiments, the manufacturing system 350 can be configured, such as by one or more operations performed by one or more of the manufacturing devices 352 in view of one or more instructions provided by the processor 354, to construct a qubit layout, such as on a chip substrate. The manufacturing devices 352 can, among other operations, perform welding, lasering, pick and place, and/or the like.

Turning now first to FIG. 4, a unit cell 400 is illustrated that can be constructed in duplicate and coupled, such as connected via one or more couplers, to the respective duplicates to form the qubit layout 500 of FIG. 5. Repetitive description of like elements employed in one or more embodiments described herein is omitted for sake of brevity.

As shown, the unit cell 400 includes five qubits including both high frequency qubits 408 (dark-colored) and low frequency qubits 410 (light-colored) that are connected to one another by couplers 412. High frequency qubits 408 can have resonant frequencies higher than resonant frequencies of the low frequency qubits 410. As shown, a qubit unit cell 400 can comprise a greater quantity of high frequency qubits 408 than low frequency qubits 410. Also as shown, the unit cell 400 defines at least one row having alternated high and low frequency qubits (e.g., high frequency qubit, low frequency qubit, high frequency qubit, low frequency qubit, and so forth) connected in series.

Connections between qubits and/or between unit cells can be made by couplers 412. The couplers 412 can be flux tunable or non-flux tunable. Couplers 412 that are flux tunable can be mixed with couplers 412 that are non-flux tunable in a same unit cell or in a same qubit layout.

Also as shown, the unit cell 400 includes at least one high cross talk group 402 and at least part of a low cross talk group 404. As illustrated, the particular unit cell 400 includes a pair of high cross talk groups 402 and does not include a full low cross talk group 404. Only part of the low cross talk group 404 is present in the unit cell 400, as illustrated by the partially empty dotted line box 404 at unit cell 400. While the cross talk groups are illustrated as comprising particular qubit islands of qubits (i.e., within the dotted lines), the dotted lines can be redrawn to encompass the full qubits having the qubit islands encompassed by the depicted dotted lines.

The high and low cross talk groups have different qubit island connection orders. For example, a high cross talk group 402 can comprise one island of a high frequency qubit 408 connected to one island of a low frequency qubit 410, with the same island of the low frequency qubit 410 being connected to one island of another high frequency qubit 408. A low cross talk group 404 can comprise one island of a high frequency qubit 408 connected to one island of another high frequency qubit 408, with the other island of the same low frequency qubit 410 connected to an island of another high frequency qubit 408. That is, a high cross talk group 402 or a low cross talk group 404 can include a pair of high frequency qubits 408 and a single low frequency qubit 410, with the low frequency qubit 410 connected between the high frequency qubits 408 by couplers 412.

Particular orientation of qubits 408, 410 within a unit cell 400 can be to allow for shortest lengths of couplers 412 between qubit islands within the unit cell 400 and to connect by couplers 412 to qubit islands of other unit cells 400 of a larger qubit layout (e.g., qubit layout 500).

As illustrated at small section 450, a pair of unit cells 400-A and 400-B can be connected, such as by a coupler 412-A. A full low cross talk group 404 can be formed by the unit cells 400-A and 400-B together.

Turning next to FIG. 5, as illustrated, the unit cell 400 can be duplicated even more times, such as a plurality of times, and the unit cells 400 can be coupled to one another to form a larger section 500, which can also be referred to as a qubit layout 500, which can be a section (e.g., akin to the section 304) of a larger qubit layout of a chip, for example.

Further, a different unit cell arrangement 400-B, having the same number and type of qubits as unit cell 400, could alternatively be tiled (e.g., repeated unit cells being connected to one another) to form a same qubit lattice having same features.

The qubit layout 500 comprises high frequency qubits 408, low frequency qubits 410, high cross talk groups 402 and low cross talk groups 404, in view of comprising unit cells 400. The qubit layout 500 can comprise more high frequency qubits 408 than low frequency qubits 410.

The cross talk groups 402 and 404 are generally coupled, at least partially, in series. As shown, one or more qubits (e.g., qubit 506) can be common to two or more cross talk groups, such as to two high cross talk groups 402. In one or more cases, the qubit layout 500 can comprise a quantity of high cross talk groups 402 that is equal to or lesser than a quantity of low cross talk groups 404.

High cross talk groups 402 can each have a same first connection order of qubit islands. Low cross talk groups 404 likewise also can have a same second connection order of qubit islands.

All qubits of the qubit layout 500 have an island that is part of at least one high cross talk group 402. One or more islands of lower frequency qubits 410 can have more than one coupler 412 connected thereto. Each low frequency qubit 410 can be coupled to three different high frequency qubits 408. Each high frequency qubit 408 can be coupled to no more than two other qubits, which can be only low frequency qubits 410. Each island of each high frequency qubit 408 can have only one coupler 412 connected thereto at most.

The qubit layout 500 can be in the form of a heavy hex lattice. This lattice can comprise rows of alternated high frequency and low frequency qubits coupled in series by couplers 412. The rows can be coupled to one another by connector qubits 514, being high frequency qubits 408. Each of the connector qubits 514 can be spaced apart from, and thus not directly connected to, other of the connector qubits 514. Each of the connector qubits 514 can be part of one high cross talk group 402. As shown, each connector qubit 514 can be part of three or fewer different low cross talk groups 404.

Note that the orientational arrangement (e.g., physical rotation on a substrate relative to one another) of qubits 408, 410 relative to one another is illustrated in a particular construction to reduce coupling distance of the couplers between islands, and to beneficially arrange qubit islands more adjacent to one another for coupling. However, different rotations of different qubits can be used relative to one another, such as with longer couplings therebetween.

Likewise note that each of the unit cells 400 comprised by the qubit layout 500 can have a same orientation relative to one another. In this way, the unit cells 400 can be connected together in series in a plurality of adjacent rows. Thus, different rows of the qubit layout 500 can comprise a same repeated order of the different, interconnected cross talk groups 402, 404. Thus, different rows can comprise qubit islands of the alternated high and low frequency qubits 408, 410 connected in a same connection order at different rows. One row can be physically shifted along a row relative to another.

Individual unit cells 400 of adjacent rows are coupled to one another by single couplers 412. A unit cell 400 can thus be coupled to two other unit cells of two adjacent rows (e.g., bounding the row having the unit cell 400) by two different single couplers 412.

An advantage of a device employing the qubit layout 500 can be minimized inclusion of high cross talk groups within a multi-qubit arrangement. Further in view of the multi-qubit arrangement including a plurality of nearest-neighbor qubits, cross talk can generally be minimized between the plurality of qubits, and thus stray inadvertent couplings between qubits or between couplers and non-intended qubits can be limited. This arrangement thus can allow for greater interaction strengths between qubits to be employed.

By employing the qubit layout 500 as defined herein, minimization of high cross talk groups can be facilitated, where it can be desirable for outer qubits of a cross talk configuration to have higher resonant frequency, which than can be inadvertently shifted less. These reduced inadvertent shifts can lead to a lower probability of an undesirable collision between resonant frequencies. Further, by employing one or more of the flux tunable couplers coupling the qubits of the plurality of qubits to one another, an advantage can be ability to dynamically tune one or more resonant frequencies of one or more of the qubits.

Turning now to FIG. 6, a unit cell 600 is illustrated that can be constructed in duplicate and coupled, such as connected via one or more couplers, to the respective duplicates to form the qubit layout 700 of FIG. 7. Repetitive description of like elements employed in one or more embodiments described herein is omitted for sake of brevity.

As shown, the unit cell 600 includes five qubits including both high frequency qubits 608 (dark-colored) and low frequency qubits 610 (light-colored) that are connected to one another by couplers 612. High frequency qubits 608 can have resonant frequencies higher than resonant frequencies of the low frequency qubits 610. As shown, a qubit unit cell 600 can comprise a greater quantity of high frequency qubits 608 than low frequency qubits 610. Also as shown, the unit cell 600 defines at least one row having alternated high and low frequency qubits (e.g., high frequency qubit, low frequency qubit, high frequency qubit, low frequency qubit, and so forth) connected in series.

Connections between qubits and/or between unit cells can be made by couplers 612. The couplers 612 can be flux tunable or non-flux tunable. Couplers 612 that are flux tunable can be mixed with couplers 612 that are non-flux tunable in a same unit cell or in a same qubit layout.

Also as shown, the unit cell 600 includes at least one low cross talk group 604 and at least part of a high cross talk group 602. As illustrated, the particular unit cell 600 includes a pair of partial high cross talk groups 602 and a full low cross talk group 604. Only part of the high cross talk groups 602 is present in the unit cell 600, as illustrated by the partially empty dotted line boxes 602 at unit cell 600. While the cross talk groups are illustrated as comprising particular qubit islands of qubits (i.e., within the dotted lines), the dotted lines can be redrawn to encompass the full qubits having the qubit islands encompassed by the depicted dotted lines.

The high and low cross talk groups have different qubit island connection orders. For example, a high cross talk group 602 can comprise one island of a high frequency qubit 608 connected to one island of a low frequency qubit 610, with the same island of the low frequency qubit 610 being connected to one island of another high frequency qubit 608. A low cross talk group 604 can comprise one island of a high frequency qubit 608 connected to one island of another high frequency qubit 608, with the other island of the same low frequency qubit 610 connected to an island of another high frequency qubit 608. That is, a high cross talk group 602 or a low cross talk group 604 can include a pair of high frequency qubits 608 and a single low frequency qubit 610, with the low frequency qubit 610 connected between the high frequency qubits 608 by couplers 612.

Particular orientation of qubits 608, 610 within a unit cell 600 can be to allow for shortest lengths of couplers 612 between qubit islands within the unit cell 600 and to connect by couplers 612 to qubit islands of other unit cells 600 of a larger qubit layout (e.g., qubit layout 700).

As illustrated at small section 650, a pair of unit cells 600-A and 600-B can be connected, such as by a coupler 612-A. A full high cross talk group 602 can be formed by the unit cells 600-A and 600-B together.

Turning now to FIG. 7, as illustrated, the unit cell 700 can be duplicated even more times, such as a plurality of times, and the unit cells 700 can be coupled to one another to form a larger section 700, which can also be referred to as a qubit layout 700, which can be a section (e.g., akin to the section 704) of a larger qubit layout of a chip, for example.

The qubit layout 700 comprises high frequency qubits 608, low frequency qubits 610, high cross talk groups 602 and low cross talk groups 604, in view of comprising unit cells 600. The qubit layout 700 can comprise more high frequency qubits 608 than low frequency qubits 610.

The cross talk groups 602 and 604 are generally coupled, at least partially, in series. As shown, one or more qubits (e.g., qubit 706) can be common to two or more cross talk groups, such as to two high cross talk groups 602. In one or more cases, the qubit layout 700 can comprise a quantity of high cross talk groups 602 that is equal to or lesser than a quantity of low cross talk groups 604.

High cross talk groups 602 can each have a same first connection order of qubit islands. Low cross talk groups 604 likewise also can have a same second connection order of qubit islands.

Each low frequency qubit 610 can be coupled to three or fewer different high frequency qubits 608. One or more islands of lower frequency qubits 610 can have more than one coupler 612 connected thereto. Each high frequency qubit 608 can be coupled to no more than two other qubits, which are only low frequency qubits 610. Each island of each high frequency qubit 608 has only one coupler 612 connected thereto.

The qubit layout 700 can be in the form of a heavy hex lattice. This lattice can comprise rows of alternated high frequency and low frequency qubits coupled in series by couplers 612. The rows can be coupled to one another by connector qubits 714, being high frequency qubits 608. Each of the connector qubits 714 can be spaced apart from, and thus not directly connected to, other of the connector qubits 714. Each of the connector qubits 714 can be part of two different high cross talk groups 702, different than the qubit layout 500. As shown, each connector qubit 714 also can be part of two different low cross talk groups 604. That is, different cross talk groups can overlap by comprising one or more same qubits (and thus one or more same qubit islands) as one another. In one or more embodiments, pairs of cross talk groups that overlap can have the same connection order of qubit islands.

Note that the orientational arrangement (e.g., physical rotation on a substrate relative to one another) of qubits relative to one another is illustrated in a particular construction to reduce coupling distance of the couplers between islands, and to beneficially arrange islands more adjacent to one another for coupling. However, different rotations of different qubits can be used relative to one another, such as with longer couplings therebetween.

Likewise note that each of the unit cells 600 comprised by the qubit layout 700 can have a same orientation relative to one another. In this way, the unit cells 600 can be connected together in series in a plurality of adjacent rows. Thus, different rows of the qubit layout 700 can comprise a same repeated order of the different, interconnected cross talk groups 602, 604. Thus, different rows can comprise qubit islands of the alternated high and low frequency qubits 608, 610 connected in a same connection order at different rows. One row can be physically shifted along a row relative to another.

Individual unit cells 600 of adjacent rows are coupled to one another by single couplers 612. A unit cell 600 can thus be coupled to two other unit cells of two adjacent rows (e.g., bounding the row having the unit cell 600) by two different single couplers 612.

An advantage of a device employing the qubit layout 700 can be minimized inclusion of high cross talk groups within a multi-qubit arrangement. Further in view of the multi-qubit arrangement including a plurality of nearest-neighbor qubits, cross talk can generally be minimized between the plurality of qubits, and thus stray inadvertent couplings between qubits or between couplers and non-intended qubits can be limited. This arrangement thus can allow for greater interaction strengths between qubits to be employed.

By employing the qubit layout 700 as defined herein, minimization of high cross talk groups can be facilitated, where it can be desirable for outer qubits of a cross talk configuration to have higher resonant frequency, which than can be inadvertently shifted less. These reduced inadvertent shifts can lead to a lower probability of an undesirable collision between resonant frequencies. Further, by employing one or more of the flux tunable couplers coupling the qubits of the plurality of qubits to one another, an advantage can be ability to dynamically tune one or more resonant frequencies of one or more of the qubits.

Turning now to FIG. 8, a unit cell 800 is illustrated that can be constructed in duplicate and coupled, such as connected via one or more couplers, to the respective duplicates to form the qubit layout 900 of FIG. 9. Repetitive description of like elements employed in one or more embodiments described herein is omitted for sake of brevity.

As shown, the unit cell 800 includes four qubits including high frequency qubits 808 (dark-colored) and low frequency qubits 810, 809 (light-colored) that are connected to one another by couplers 812. High frequency qubits 808 can have resonant frequencies higher than resonant frequencies of the low frequency qubits 810, 809.

In view of the tight/dense arrangement of qubits, the square lattice of the qubit unit cell 800 can function via a trade-off between closer connectivity and distortion/noise/overlapping of frequencies. To at least partially less the overlap, the low frequency band at the square lattice unit cell 800 can be split into two separate frequency bands. Thus, the low frequency qubits of unit cell 800 can comprise both low-low frequency qubits 810 and low-medium frequency qubits 809. As shown, a qubit unit cell 800 can comprise a greater quantity of high frequency qubits 808 than low frequency qubits 810, 809. Also as shown, the unit cell 800 can comprise at least one qubit row, and particularly two adjacent qubit rows, having alternated high and low frequency qubits (e.g., high frequency qubit, low frequency qubit, high frequency qubit, low frequency qubit, and so forth) connected in series.

Connections between qubits and/or between unit cells can be made by couplers 812. The couplers 812 can be flux tunable or non-flux tunable. Couplers 812 that are flux tunable can be mixed with couplers 812 that are non-flux tunable in a same unit cell or in a same qubit layout.

Also as shown, the unit cell 800 can comprise at least one high cross talk group 802 and at least part of a low cross talk group 804. As illustrated, the particular unit cell 800 includes a single high cross talk group 802 and does not include a full low cross talk group 804. Only part of the low cross talk group 804 is present in the unit cell 800, as can be seen at FIG. 9. While the cross talk groups are illustrated as comprising particular qubit islands of qubits (i.e., within the dotted lines), the dotted lines can be redrawn to encompass the full qubits having the qubit islands encompassed by the depicted dotted lines.

Each high cross talk group 802 can comprise a pair of high frequency qubits 808, a low-low frequency qubit 810 and a low-medium frequency qubit 809.

Particular orientation of qubits 808, 809, 810 within a unit cell 800 can be to allow for shortest lengths of couplers 812 between qubit islands within the unit cell 800 and to connect by couplers 812 to qubit islands of other unit cells 800 of a larger qubit layout (e.g., qubit layout 900).

As illustrated at small section 850, a pair of unit cells 800-A and 800-B can be connected, such as by a pair of couplers 812-A (e.g., different than a single coupler as in small sections 450 and 650). A full low cross talk group 804 can be formed by the unit cells 800-A and 800-B together.

Turning now to FIG. 9, a square lattice qubit layout 900 is illustrated, different from the hex/heavy hex lattices of the qubit layouts 500 and 700.

As shown, high cross talk groups 802 and low cross talk groups 804 are included. Each high cross talk group 802 can comprise at least one qubit being common with another high cross talk group 802. As shown, central high cross talk groups 802-C of the lattice (e.g., where the high cross talk group is fully bounded by other qubits of the qubit layout) can have each qubit thereof shared in common with one other high cross talk group. That is, five different high cross talk groups 802 can overlap via the central high cross talk group 802-C. Indeed, operation of the lattice can involve greater complexity as compared to the heavy hex lattices discussed herein.

Depending on location of the high frequency qubits 808 in the square lattice, one or both islands of a high frequency qubit 808 can have two couplers 812 connected thereto.

Like the qubit layouts 500 and 700, the square lattice qubit layout 900 comprises rows of alternated high and low frequency qubits, such as alternated high frequency qubits 808 and low-low frequency qubits 810, or such as alternated high frequency qubits 808 and low-medium frequency qubits 809.

Note that the orientational arrangement (e.g., physical rotation on a substrate relative to one another) of qubits relative to one another is illustrated in a particular construction to reduce coupling distance of the couplers between islands, and to beneficially arrange islands more adjacent to one another for coupling. However, different rotations of different qubits can be used relative to one another, such as with longer couplings therebetween.

Likewise note that each of the unit cells 800 comprised by the qubit layout 900 can have a same orientation relative to one another. In this way, the unit cells 800 can be connected together in series in a plurality of adjacent rows. Thus, different rows of the qubit layout 900 can comprise a same repeated order of the different, interconnected cross talk groups 802, 804. Thus, also, different rows can comprise qubit islands of the alternated high and low frequency qubits 808, 809, 810 connected in a same connection order at different rows. One row can be physically shifted along a row relative to one another.

Individual unit cells 800 of adjacent rows are coupled to one another by single couplers 812. A unit cell 800 can thus be coupled to two other unit cells of two adjacent rows (e.g., bounding the row having the unit cell 800) by two different single couplers 812 (not particularly shown).

An advantage of a device employing the arrangement 900 can be minimized inclusion of high cross talk groups within a multi-qubit arrangement. Further in view of the multi-qubit arrangement including a plurality of nearest-neighbor qubits, cross talk can generally be minimized between the plurality of qubits, and thus stray inadvertent couplings between qubits or between couplers and non-intended qubits can be limited. This arrangement thus can allow for greater interaction strengths between qubits to be employed.

By employing the arrangement 900 as defined herein, minimization of high cross talk groups can be facilitated, where it can be desirable for outer qubits of a cross talk configuration to have higher resonant frequency, which than can be inadvertently shifted less. These reduced inadvertent shifts can lead to a lower probability of an undesirable collision between resonant frequencies. Further, by employing one or more of the flux tunable couplers coupling the qubits of the plurality of qubits to one another, an advantage can be ability to dynamically tune one or more resonant frequencies of one or more of the qubits.

Figure 10:
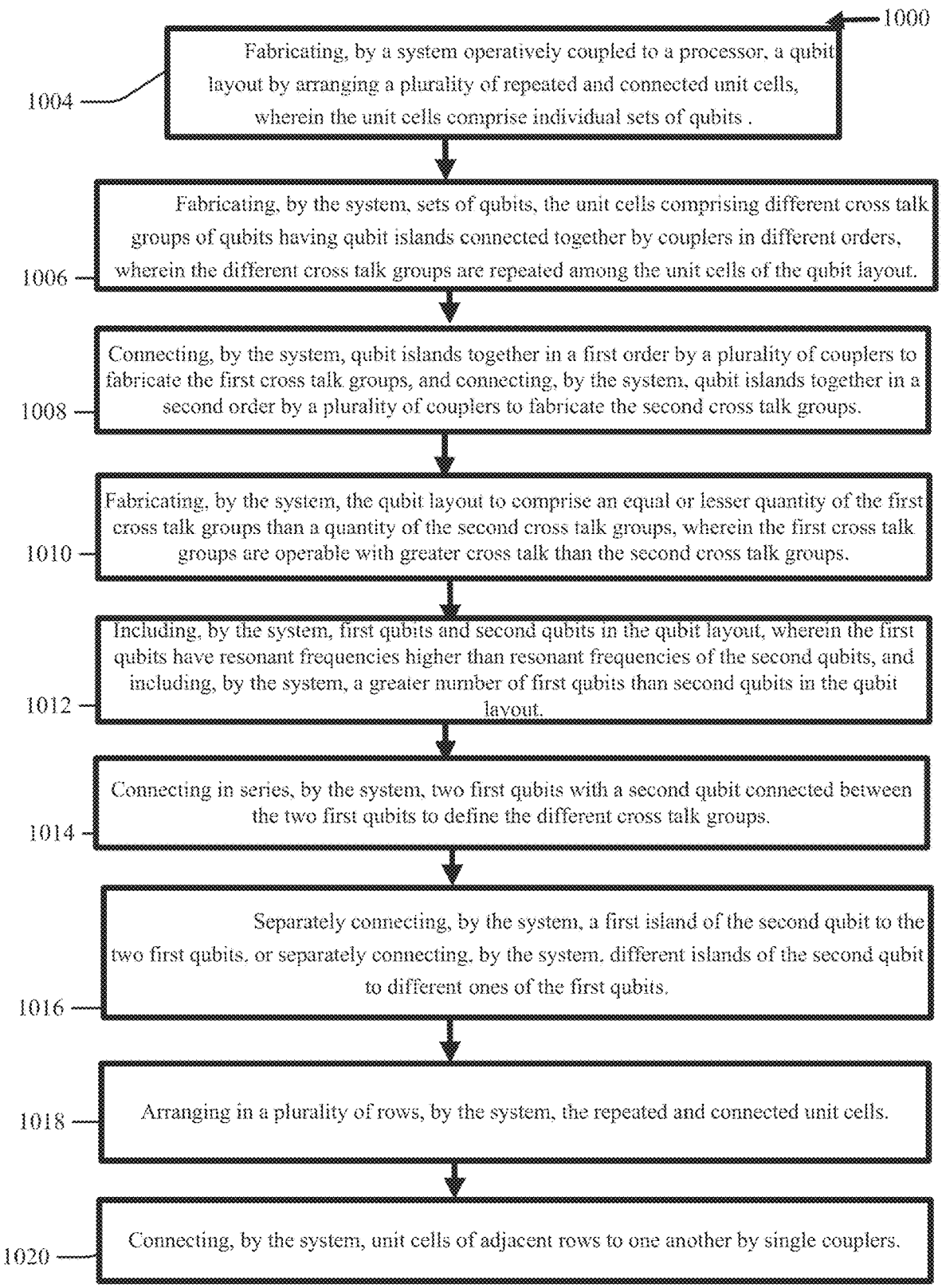
FIG. 10 illustrates a flow diagram of an example method to fabricate a tiling arrangement, in accordance with one or more embodiments described herein.

Next, FIG. 10 illustrates a flow diagram of an example, non-limiting method 1000 that can facilitate a process to reduce cross talk between qubits of a multi-qubit quantum logic circuit, such as the quantum logic circuit 108 of FIG. 1. While the non-limiting method 1000 is described relative to the qubit layout 300 of FIG. 3, the non-limiting method 1100 can be applicable also to other systems and/or devices described herein, such as the qubit layouts illustrated at FIGS. 5, 7 and/or 9. Repetitive description of like elements and/or processes employed in respective embodiments is omitted for sake of brevity.

At 1004, the non-limiting method 1000 can comprise fabricating, by a system (e.g., system 350) operatively coupled to a processor (e.g., processor 354), a qubit layout by arranging a plurality of repeated and connected unit cells, wherein the unit cells comprise individual sets of qubits.

At 1006, the non-limiting method 1000 can comprise fabricating, by the system (e.g., system 350), the unit cells comprising different cross talk groups of qubits having qubit islands connected together by couplers in different orders, wherein the different cross talk groups are repeated among the unit cells of the qubit layout.

At 1008, the non-limiting method 1000 can comprise connecting, by the system (e.g., system 350), qubit islands together in a first order by a plurality of couplers to fabricate, by the system (e.g., system 350), the first cross talk groups, and connecting, by the system (e.g., system 350), qubit islands together in a second order by a plurality of couplers to fabricate, by the system (e.g., system 350), the second cross talk groups.

At 1010, the non-limiting method 1000 can comprise fabricating, by the system (e.g., system 350), the qubit layout to comprise an equal or lesser quantity of the first cross talk groups than a quantity of the second cross talk groups, wherein the first cross talk groups are operable with greater cross talk than the second cross talk groups.

At 1012, the non-limiting method 1000 can comprise including, by the system (e.g., system 350), first qubits and second qubits in the qubit layout, wherein the first qubits have resonant frequencies higher than resonant frequencies of the second qubits, and including, by the system (e.g., system 350), a greater number of first qubits than second qubits in the qubit layout.

At 1014, the non-limiting method 1000 can comprise connecting in series, by the system (e.g., system 350), two first qubits with a second qubit connected between the two first qubits to define the different cross talk groups.

At 1016, the non-limiting method 1000 can comprise separately connecting, by the system (e.g., system 350), a first island of the second qubit to the two first qubits, or separately connecting, by the system (e.g., system 350), different islands of the second qubit to different ones of the first qubits.

At 1018, the non-limiting method 1000 can comprise arranging in a plurality of rows, by the system (e.g., system 350), the repeated and connected unit cells.

At 1020, the non-limiting method 1000 further can comprise connecting, by the system (e.g., system 350), unit cells of adjacent rows to one another by single couplers.

Figure 11:
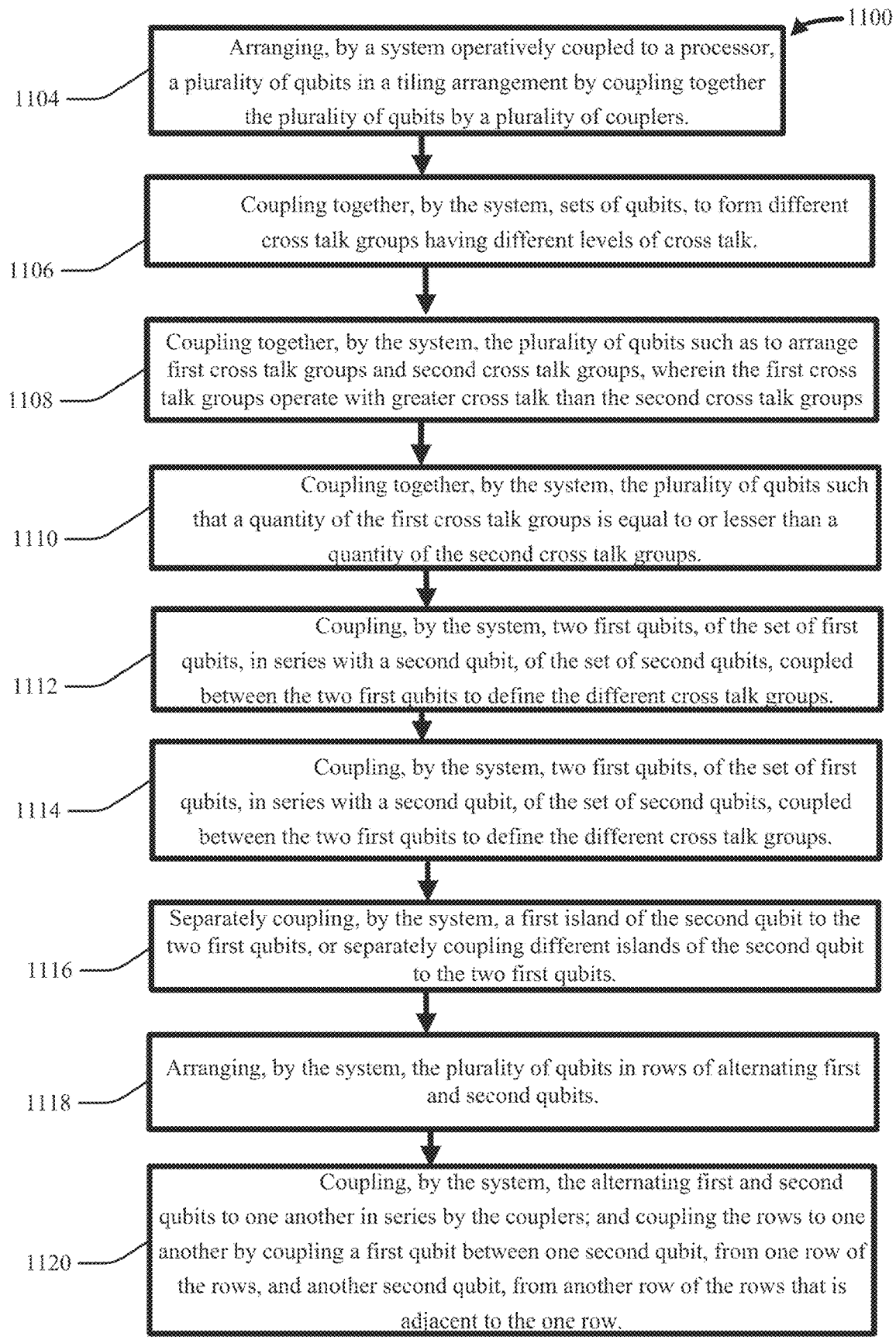
FIG. 11 illustrates a flow diagram of another example method to fabricate a tiling arrangement, in accordance with one or more embodiments described herein.

Next, FIG. 11 illustrates a flow diagram of another example, non-limiting method 1100 that can facilitate a process to fabricate a qubit layout to reduce cross talk between qubits of a multi-qubit quantum logic circuit, such as the quantum logic circuit 108 of FIG. 1. While the non-limiting method 1100 is described relative to the qubit layout 300 of FIG. 3, the non-limiting method 1100 can be applicable also to other systems and/or devices described herein, such as the qubit layouts illustrated at FIGS. 5, 7 and/or 9. Repetitive description of like elements and/or processes employed in respective embodiments is omitted for sake of brevity.

At 1104, the non-limiting method 1100 can comprise arranging, by a system (e.g., system 350) operatively coupled to a processor (e.g., processor 354), a plurality of qubits in a tiling arrangement by coupling together the plurality of qubits by a plurality of couplers.

At 1106, the non-limiting method 1100 can comprise coupling together, by the system (e.g., system 350), sets of qubits, to form different cross talk groups having different levels of cross talk.

At 1108, the non-limiting method 1100 can comprise coupling together, by the system (e.g., system 350), the plurality of qubits such as to arrange first cross talk groups and second cross talk groups, wherein the first cross talk groups operate with greater cross talk than the second cross talk groups.

At 1110, the non-limiting method 1100 can comprise coupling together, by the system (e.g., system 350), the plurality of qubits such that a quantity of the first cross talk groups is equal to or lesser than a quantity of the second cross talk groups.

At 1112, the non-limiting method 1100 can comprise coupling, by the system (e.g., system 350), two first qubits, of the set of first qubits, in series with a second qubit, of the set of second qubits, coupled between the two first qubits to define the different cross talk groups. That is, the plurality of qubits can comprise a set of first qubits and a set of second qubits, and wherein the second qubits have resonant frequencies lower than resonant frequencies of the first qubits.

At 1114, the non-limiting method 1100 can comprise coupling, by the system (e.g., system 350), two first qubits, of the set of first qubits, in series with a second qubit, of the set of second qubits, coupled between the two first qubits to define the different cross talk groups.

At 1116, the non-limiting method 1100 can comprise separately coupling, by the system (e.g., system 350), a first island of the second qubit to the two first qubits, or separately coupling different islands of the second qubit to the two first qubits.

At 1118, the non-limiting method 1100 can comprise arranging, by the system (e.g., system 350), the plurality of qubits in rows of alternated first and second qubits.

At 1120, the non-limiting method 1100 further can comprise coupling, by the system (e.g., system 350), the alternated first and second qubits to one another in series by the couplers; and coupling the rows to one another by coupling a first qubit between one second qubit, from one row of the rows, and another second qubit, from another row of the rows that is adjacent to the one row.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a device that can facilitate reduction of inter-qubit cross talk and/or allow for increased interaction strengths between qubits as compared to existing technologies. A device can comprise a qubit lattice comprising a plurality of repeated and connected unit cells, and the unit cells comprising individual sets of qubits, wherein the unit cells comprise different cross talk groups of qubits having qubit islands connected together by couplers in different orders, and wherein the different cross talk groups are repeated among the unit cells of the qubit lattice. A device can comprise a qubit lattice comprising a plurality of different, interconnected cross talk groups of qubits, wherein the different cross talk groups are repeated within the qubit lattice.

Referring now to each of FIGS. 3 to 9, in addition to FIGS. 1 and 2, an advantage of the one or more aforementioned device, system and/or method can be minimized inclusion of high cross talk groups within a multi-qubit arrangement. Further in view of the multi-qubit arrangement including a plurality of nearest-neighbor qubits, cross talk can generally be minimized between the plurality of qubits, and thus stray inadvertent couplings between qubits or between couplers and non-intended qubits can be limited. This arrangement thus can allow for greater interaction strengths between qubits to be employed.

By employing a device, system and/or method as defined herein, minimization of high cross talk groups can be facilitated, where it can be desirable for outer qubits of a cross talk configuration to have higher resonant frequency, which than can be inadvertently shifted less. These reduced inadvertent shifts can lead to a lower probability of an undesirable collision between resonant frequencies. Further, by employing one or more of the flux tunable couplers coupling the qubits of the plurality of qubits to one another, an advantage can be ability to dynamically tune one or more resonant frequencies of one or more of the qubits.

Further, additional software control of the multi-qubit layouts described herein can be limited or omitted. For example, software that can remedy spectator errors by providing specially crafted pulses can be omitted because the spectator errors area already minimized in hardware. This can simplify device tune up.

Indeed, in view of the one or more embodiments described herein, a practical application of the devices described herein can be ability to simultaneously raise interaction strengths that are finite-limited in existing technologies. This can be achieved by minimizing and controlling a number of configurations of high cross talk qubit groups are employed in qubit logic circuit. This is a useful and practical application of computers, especially in view of limiting undesirable shifting of qubit frequencies and/or undesirable nearest neighbor stray couplings, and thus facilitating enhanced (e.g., improved and/or optimized) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system, e.g., to facilitate an enhanced quantum logic circuit layout, that can receive as input a quantum job request and can measure a real-world qubit state of one or more qubits, such as superconducting qubits, of the quantum system.

Moreover, a device and/or method described herein can be implemented in one or more domains, such as quantum domains, to enable scaled quantum program executions. Indeed, use of a device as described herein can be scalable, such as where a device described herein can be employed in quantity with a single quantum system or at multiple quantum systems. As a result, increased scaling of qubits provided in a cryogenic chamber can be enabled with less concern for stray couplings or unintended frequency shiftings.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, facilitate program and/or program instruction execution, such as relative to control cross talk between a plurality of qubits, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively limit qubit cross talk as the one or more embodiments described herein can facilitate this process. And, neither can the human mind nor a human with pen and paper limit qubit cross talk, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 12:
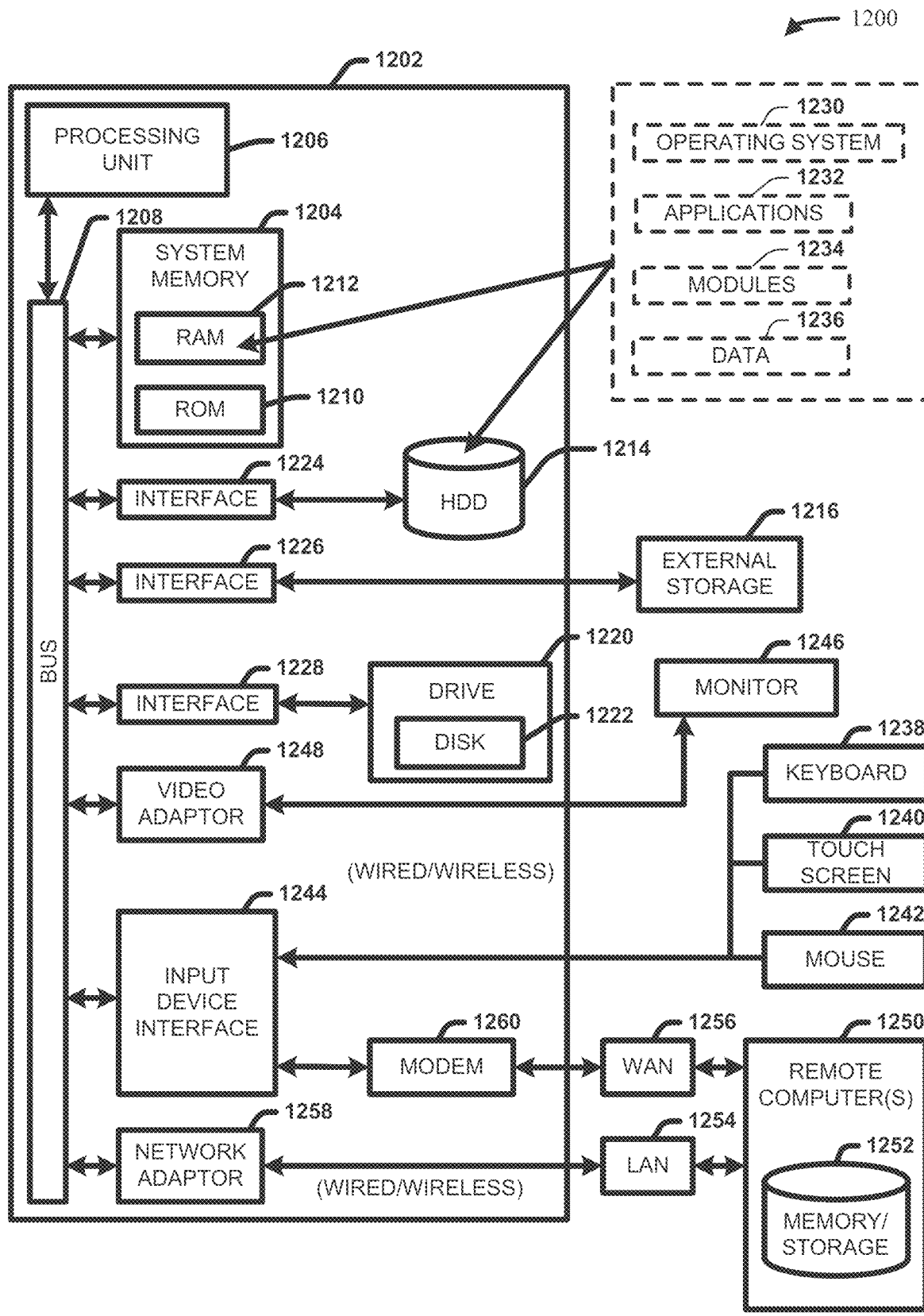
FIG. 12 illustrates a block diagram of an example, non-limiting, operating environment in which one or more embodiments described herein can be facilitated.
Figure 13:
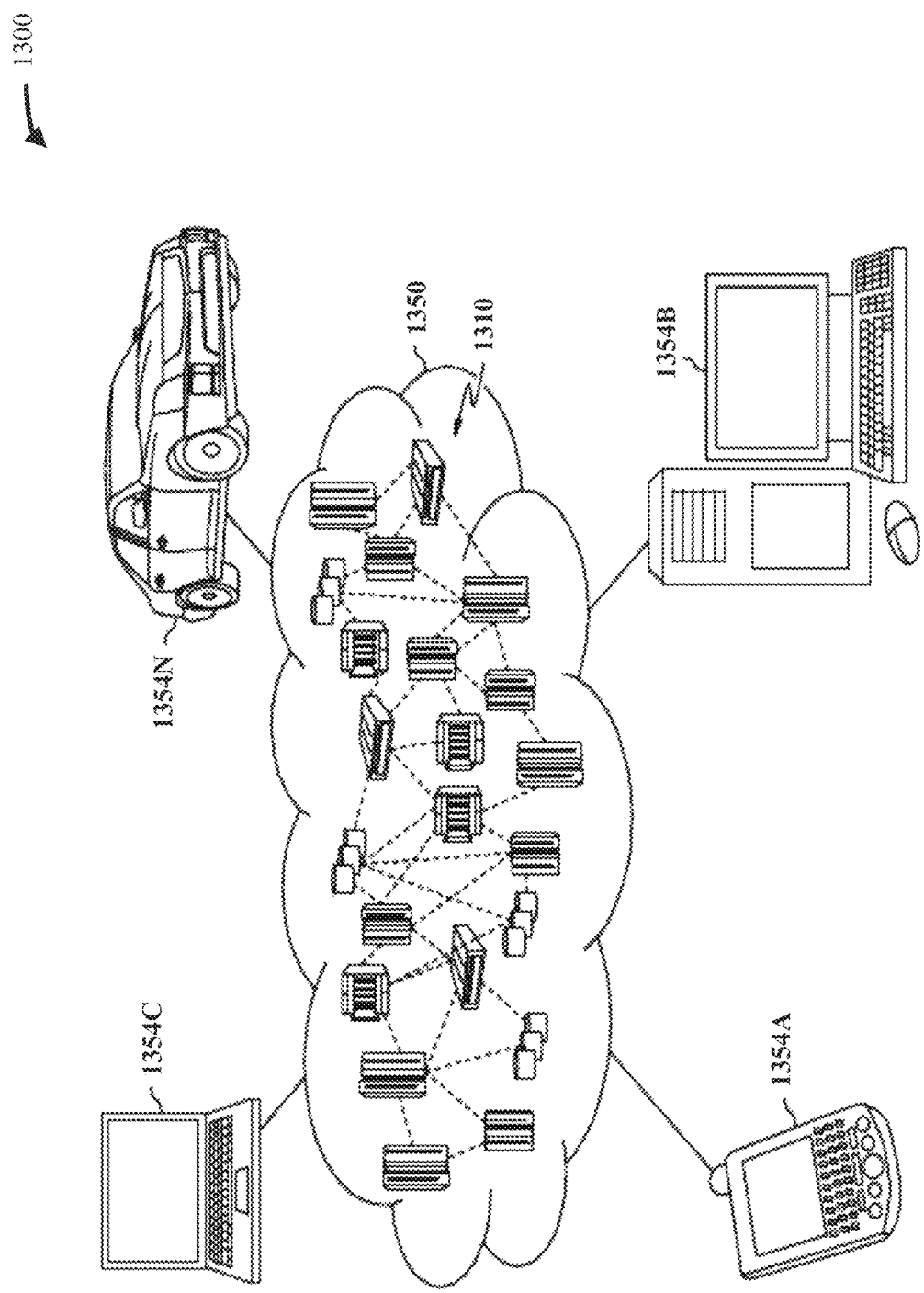
FIG. 13 illustrates a block diagram of an example, non-limiting, cloud computing environment in accordance with one or more embodiments described herein.
Figure 14:
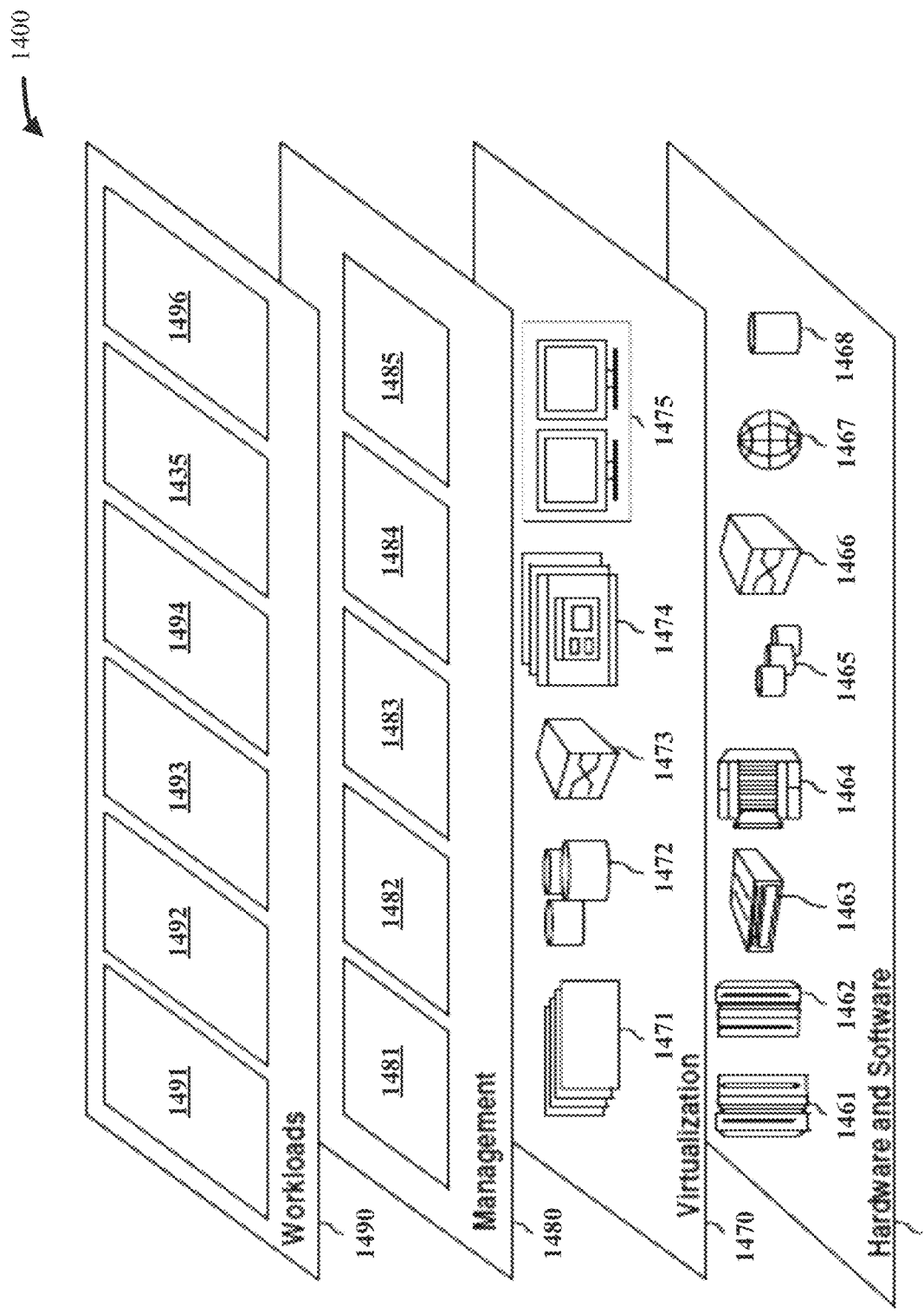
FIG. 14 illustrates a block diagram of example, non-limiting, abstraction model layers in accordance with one or more embodiments described herein.

Turning next to FIGS. 12-14, a detailed description is provided of additional context for the one or more embodiments described herein at FIGS. 1-11.

FIG. 12 and the following discussion are intended to provide a brief, general description of a suitable operating environment 800 in which one or more embodiments described herein at FIGS. 1-11 can be implemented. For example, one or more components and/or other aspects of embodiments described herein can be implemented in or be associated with, such as accessible via, the operating environment 1200. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 12, the example operating environment 1200 for implementing one or more embodiments of the aspects described herein can include a computer 1202, the computer 1202 including a processing unit 1206, a system memory 1204 and/or a system bus 1208. One or more aspects of the processing unit 1206 can be applied to processors such as 106 of the non-limiting system 100. The processing unit 1206 can be implemented in combination with and/or alternatively to processors such as 106.

Memory 1204 can store one or more computer and/or machine readable, writable and/or executable components and/or instructions that, when executed by processing unit 1206 (e.g., a classical processor, a quantum processor and/or like processor), can facilitate performance of operations defined by the executable component(s) and/or instruction(s). For example, memory 1204 can store computer and/or machine readable, writable and/or executable components and/or instructions that, when executed by processing unit 1206, can facilitate execution of the one or more functions described herein relating to non-limiting system 100, as described herein with or without reference to the one or more figures of the one or more embodiments.

Memory 1204 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 1206 can comprise one or more types of processors and/or electronic circuitry (e.g., a classical processor, a quantum processor and/or like processor) that can implement one or more computer and/or machine readable, writable and/or executable components and/or instructions that can be stored at memory 1204. For example, processing unit 1206 can perform one or more operations that can be specified by computer and/or machine readable, writable and/or executable components and/or instructions including, but not limited to, logic, control, input/output (I/O), arithmetic and/or the like. In one or more embodiments, processing unit 1206 can be any of one or more commercially available processors. In one or more embodiments, processing unit 1206 can comprise one or more central processing unit, multi-core processor, microprocessor, dual microprocessors, microcontroller, System on a Chip (SOC), array processor, vector processor, quantum processor and/or another type of processor. The examples of processing unit 1206 can be employed to implement one or more embodiments described herein.

The system bus 1208 can couple system components including, but not limited to, the system memory 1204 to the processing unit 1206. The system bus 1208 can comprise one or more types of bus structure that can further interconnect to a memory bus (with or without a memory controller), a peripheral bus and/or a local bus using one or more of a variety of commercially available bus architectures. The system memory 1204 can include ROM 1210 and/or RAM 1212. A basic input/output system (BIOS) can be stored in a non-volatile memory such as ROM, erasable programmable read only memory (EPROM) and/or EEPROM, which BIOS contains the basic routines that help to transfer information among elements within the computer 1202, such as during startup. The RAM 1212 can include a high-speed RAM, such as static RAM for caching data.

The computer 1202 can include an internal hard disk drive (HDD) 1214 (e.g., EIDE, SATA), one or more external storage devices 1216 (e.g., a magnetic floppy disk drive (FDD), a memory stick or flash drive reader, a memory card reader and/or the like) and/or a drive 1220, e.g., such as a solid state drive or an optical disk drive, which can read or write from a disk 1222, such as a CD-ROM disc, a DVD, a BD and/or the like. Additionally, and/or alternatively, where a solid state drive is involved, disk 1222 could not be included, unless separate. While the internal HDD 1214 is illustrated as located within the computer 1202, the internal HDD 1214 can also be configured for external use in a suitable chassis (not shown). Additionally, while not shown in operating environment 1200, a solid state drive (SSD) can be used in addition to, or in place of, an HDD 1214. The HDD 1214, external storage device(s) 1216 and drive 1220 can be coupled to the system bus 1208 by an HDD interface 1224, an external storage interface 1226 and a drive interface 1228, respectively. The HDD interface 1224 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 1212, including an operating system 1230, one or more applications 1232, other program modules 1234 and/or program data 1236. All or portions of the operating system, applications, modules and/or data can also be cached in the RAM 1212. The systems and/or methods described herein can be implemented utilizing one or more commercially available operating systems and/or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12. In a related embodiment, operating system 1230 can comprise one virtual machine (VM) of multiple VMs hosted at computer 1202. Furthermore, operating system 1230 can provide runtime environments, such as the JAVA runtime environment or the .NET framework, for applications 1232. Runtime environments are consistent execution environments that can allow applications 1232 to run on any operating system that includes the runtime environment. Similarly, operating system 1230 can support containers, and applications 1232 can be in the form of containers, which are lightweight, standalone, executable packages of software that include, e.g., code, runtime, system tools, system libraries and/or settings for an application.

Further, computer 1202 can be enabled with a security module, such as a trusted processing module (TPM). For instance, with a TPM, boot components hash next in time boot components and wait for a match of results to secured values before loading a next boot component. This process can take place at any layer in the code execution stack of computer 1202, e.g., applied at application execution level and/or at operating system (OS) kernel level, thereby enabling security at any level of code execution.

An entity can enter and/or transmit commands and/or information into the computer 1202 through one or more wired/wireless input devices, e.g., a keyboard 1238, a touch screen 1240 and/or a pointing device, such as a mouse 1242. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be coupled to the processing unit 1206 through an input device interface 1244 that can be coupled to the system bus 1208, but can be coupled by other interfaces, such as a parallel port, an IEEE 1394 serial port, a game port, a USB port, an IR interface, a BLUETOOTH® interface and/or the like.

A monitor 1246 or other type of display device can be alternatively and/or additionally coupled to the system bus 1208 via an interface, such as a video adapter 1248. In addition to the monitor 1246, a computer typically includes other peripheral output devices (not shown), such as speakers, printers and/or the like.

The computer 1202 can operate in a networked environment using logical connections via wired and/or wireless communications to one or more remote computers, such as a remote computer(s) 1250. The remote computer(s) 1250 can be a workstation, a server computer, a router, a personal computer, portable computer, microprocessor-based entertainment appliance, a peer device and/or other common network node, and typically includes many or all of the elements described relative to the computer 1202, although, for purposes of brevity, only a memory/storage device 1252 is illustrated. Additionally, and/or alternatively, the computer 1202 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 1254 and/or larger networks, e.g., a wide area network (WAN) 1256. LAN and WAN networking environments can be commonplace in offices and companies and can facilitate enterprise-wide computer networks, such as intranets, all of which can connect to a global communications network, e.g., the Internet.

When used in a LAN networking environment, the computer 1202 can be coupled to the local network 1254 through a wired and/or wireless communication network interface or adapter 1258. The adapter 1258 can facilitate wired and/or wireless communication to the LAN 1254, which can also include a wireless access point (AP) disposed thereon for communicating with the adapter 1258 in a wireless mode.

When used in a WAN networking environment, the computer 1202 can include a modem 1260 and/or can be coupled to a communications server on the WAN 1256 via other means for establishing communications over the WAN 1256, such as by way of the Internet. The modem 1260, which can be internal and/or external and a wired and/or wireless device, can be coupled to the system bus 1208 via the input device interface 1244. In a networked environment, program modules depicted relative to the computer 1202 or portions thereof can be stored in the remote memory/storage device 1252. The network connections shown are merely exemplary and one or more other means of establishing a communications link among the computers can be used.

When used in either a LAN or WAN networking environment, the computer 1202 can access cloud storage systems or other network-based storage systems in addition to, and/or in place of, external storage devices 1216 as described above, such as but not limited to, a network virtual machine providing one or more aspects of storage and/or processing of information. Generally, a connection between the computer 1202 and a cloud storage system can be established over a LAN 1254 or WAN 1256 e.g., by the adapter 1258 or modem 1260, respectively. Upon coupling the computer 1202 to an associated cloud storage system, the external storage interface 1226 can, such as with the aid of the adapter 1258 and/or modem 1260, manage storage provided by the cloud storage system as it would other types of external storage. For instance, the external storage interface 1226 can be configured to provide access to cloud storage sources as if those sources were physically coupled to the computer 1202.

The computer 1202 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 13, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 1350 described below with reference to FIG. 13, and/or with reference to the one or more functional abstraction layers (e.g., quantum software and/or the like) described below with reference to FIG. 14, to execute one or more operations in accordance with one or more embodiments described herein. For example, cloud computing environment 1250 and/or one or more of the functional abstraction layers 1460, 1470, 1480 and/or 1490 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both provider and consumer of the service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 1200 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 1200 can be employed to use hardware and/or software to solve problems that are highly technical in nature, that are not abstract and/or that cannot be performed as a set of mental acts by a human.

Referring now to details of one or more aspects illustrated at FIG. 13, the illustrative cloud computing environment 1350 is depicted. As shown, cloud computing environment 1350 includes one or more cloud computing nodes 1310 with which local computing devices used by cloud consumers, such as, for example, personal digital assistant (PDA) or cellular telephone 1354A, desktop computer 1354B, laptop computer 1354C and/or automobile computer system 1354N can communicate. Although not illustrated in FIG. 13, cloud computing nodes 1310 can further comprise a quantum platform (e.g., quantum computer, quantum hardware, quantum software and/or the like) with which local computing devices used by cloud consumers can communicate. Cloud computing nodes 1310 can communicate with one another. They can be grouped (not shown) physically or virtually, in one or more networks, such as Private, Community, Public, or Hybrid clouds as described hereinabove, or a combination thereof. This allows cloud computing environment 1350 to offer infrastructure, platforms and/or software as services for which a cloud consumer does not need to maintain resources on a local computing device. It is understood that the types of computing devices 1354A-N shown in FIG. 13 are intended to be illustrative only and that cloud computing nodes 1310 and cloud computing environment 1350 can communicate with any type of computerized device over any type of network and/or network addressable connection (e.g., using a web browser).

Referring now to details of one or more aspects illustrated at FIG. 14, a set 1400 of functional abstraction layers is shown, such as provided by cloud computing environment 1350 (FIG. 13). One or more embodiments described herein can be associated with, such as accessible via, one or more functional abstraction layers described below with reference to FIG. 14 (e.g., hardware and software layer 1460, virtualization layer 1470, management layer 1480 and/or workloads layer 1490). It should be understood in advance that the components, layers and/or functions shown in FIG. 14 are intended to be illustrative only and embodiments described herein are not limited thereto. As depicted, the following layers and/or corresponding functions are provided:

Hardware and software layer 1460 can include hardware and software components. Examples of hardware components include: mainframes 1461; RISC (Reduced Instruction Set Computer) architecture-based servers 1462; servers 1463; blade servers 1464; storage devices 1465; and/or networks and/or networking components 1466. In one or more embodiments, software components can include network application server software 1467, quantum platform routing software 1468; and/or quantum software (not illustrated in FIG. 14).

Virtualization layer 1470 can provide an abstraction layer from which the following examples of virtual entities can be provided: virtual servers 1471; virtual storage 1472; virtual networks 1473, including virtual private networks; virtual applications and/or operating systems 1474; and/or virtual clients 1475.

In one example, management layer 1480 can provide the functions described below. Resource provisioning 1481 can provide dynamic procurement of computing resources and other resources that can be utilized to perform tasks within the cloud computing environment. Metering and Pricing 1482 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1483 can provide access to the cloud computing environment for consumers and system administrators. Service level management 1484 can provide cloud computing resource allocation and/or management such that required service levels are met. Service Level Agreement (SLA) planning and fulfillment 1485 can provide pre-arrangement for, and procurement of, cloud computing resources for which a future requirement is anticipated in accordance with an SLA.

Workloads layer 1490 can provide examples of functionality for which the cloud computing environment can be utilized. Non-limiting examples of workloads and functions which can be provided from this layer include: mapping and navigation 1491; software development and lifecycle management 1492; virtual classroom education delivery 1493; data analytics processing 1494; transaction processing 1495; and/or application transformation software 1496.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be coupled to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A device, comprising:
a qubit layout comprising a plurality of repeated and connected unit cells, and the plurality of repeated and connected unit cells comprising individual sets of qubits; and
the plurality of repeated and connected unit cells comprising different cross talk groups of qubits having qubit islands connected together by couplers in different orders, wherein the different cross talk groups are repeated among the plurality of repeated and connected unit cells of the qubit layout, wherein the plurality of repeated and connected unit cells comprise first cross talk groups and second cross talk groups, and wherein the first cross talk groups are operable with greater cross talk than the second cross talk groups.

2. The device of claim 1, wherein the plurality of repeated and connected unit cells comprising the first cross talk groups of qubits have qubit islands connected together in a first order by a plurality of couplers; and
wherein the unit cells comprising the second cross talk groups of qubits have qubit islands connected together in a second order by another plurality of couplers.

3. The device of claim 2, wherein a quantity of the first cross talk groups are equal to or lesser than a quantity of the second cross talk groups in the qubit layout.

4. The device of claim 1, wherein the plurality of repeated and connected unit cells comprise first qubits and second qubits of the sets of qubits, and wherein the first qubits have resonant frequencies higher than resonant frequencies of the second qubits.

5. The device of claim 4, wherein the different cross talk groups individually comprise two first qubits connected in series with a second qubit connected between the two first qubits.

6. The device of claim 5, wherein, of the different cross talk groups of the unit cells, different groups of the two first qubits and second qubit comprise:
a first island of the second qubit connected separately to the two first qubits; or
different islands of the second qubit connected separately to different ones of the first qubits.

7. The device of claim 4, wherein the qubit layout comprises:
a greater number of first qubits than second qubits.

8. The device of claim 4, wherein the qubit layout comprises:
rows of alternated first qubits and second qubits connected to one another in series by the couplers, wherein adjacent rows are coupled to one another by one or more connector first qubits of the first qubits.

9. The device of claim 1, wherein the qubit layout comprises:
a plurality of rows of the plurality of repeated and connected unit cells,
wherein plurality of repeated and connected unit cells of adjacent rows are connected to one another by single couplers.

10. A method, comprising:
fabricating, by a system operatively coupled to a processor, a qubit layout by arranging a plurality of repeated and connected unit cells, wherein the plurality of repeated and connected unit cells comprise individual sets of qubits; and
fabricating, by the system, the plurality of repeated and connected unit cells comprising different cross talk groups of qubits having qubit islands connected together by couplers in different orders, wherein the different cross talk groups are repeated among the unit cells of the qubit layout.

11. The method of claim 10, further comprising:
connecting, by the system, qubit islands together in a first order by a plurality of couplers to fabricate, by the system, the first cross talk groups;
connecting, by the system, qubit islands together in a second order by a plurality of couplers to fabricate, by the system, the second cross talk groups; and
fabricating, by the system, the qubit layout to comprise an equal or lesser quantity of the first cross talk groups than a quantity of the second cross talk groups,
wherein the first cross talk groups are operable with greater cross talk than the second cross talk groups.

12. The method of claim 10,
wherein the fabricating the unit cells further comprises
including, by the system, first qubits and second qubits in the qubit layout, wherein the first qubits have resonant frequencies higher than resonant frequencies of the second qubits, and
wherein the fabricating the qubit layout further comprises including, by the system, a greater number of first qubits than second qubits in the qubit layout.

13. The method of claim 12, wherein the fabricating the unit cells further comprises:
connecting in series, by the system, two first qubits with a second qubit connected between the two first qubits to define the different cross talk groups.

14. The method of claim 12, wherein the fabricating the unit cells further comprises:
separately connecting, by the system, a first island of the second qubit to the two first qubits; or
separately connecting, by the system, different islands of the second qubit to different ones of the first qubits.

15. The method of claim 10, wherein the fabricating the qubit layout further comprises:
arranging in a plurality of rows, by the system, the repeated and connected unit cells; and
connecting, by the system, unit cells of adjacent rows to one another by single couplers.

16. A system, comprising:
a quantum processor; and
a qubit circuit coupled to the quantum processor, wherein the qubit circuit comprises:
a qubit layout comprising a plurality of repeated and connected unit cells, and the plurality of repeated and connected unit cells comprising individual sets of qubits;
the unit cells comprising different cross talk groups of qubits having qubit islands connected together by couplers in different orders, wherein the different cross talk groups are repeated among the unit cells of the qubit layout, and wherein the different cross talk groups have different cross talk ranges.

17. The system of claim 16, wherein the qubit layout comprises:
a plurality of rows of the plurality of the repeated and connected unit cells,
wherein the plurality of repeated and connected unit cells of adjacent rows are connected to one another by single couplers.

18. The system of claim 16, wherein the qubit layout is in the form of a heavy hex lattice or a square lattice.

19. A device, comprising:
a qubit layout comprising a plurality of different, interconnected cross talk groups of qubits, wherein the different cross talk groups are repeated within the qubit layout, wherein the different cross talk groups comprise first cross talk groups and second cross talk groups, wherein the first cross talk groups have a different cross talk range than the second cross talk groups, wherein the first cross talk groups comprise a same first connection order of qubit islands, and wherein the second cross talk groups comprise a same second connection order of qubit islands.

20. The device of claim 19, wherein different rows of the qubit layout comprise a same repeated order of the different, interconnected cross talk groups.

21. The device of claim 19, wherein pairs of cross talk groups, of the different cross talk groups, overlap by comprising one or more same qubits as one another, wherein the pair of cross talk groups have the same connection order of qubit islands.

* * * * *